United States Patent
Lewis et al.

(10) Patent No.: US 9,318,632 B2
(45) Date of Patent: Apr. 19, 2016

(54) BARE QUANTUM DOTS SUPERLATTICE PHOTONIC DEVICES

(71) Applicants: Jason E. Lewis, Lutz, FL (US); Xiaomei Jiang, Tampa, FL (US)

(72) Inventors: Jason E. Lewis, Lutz, FL (US); Xiaomei Jiang, Tampa, FL (US)

(73) Assignee: University of South Florida, Tampa, FL (US)

( * ) Notice: Subject to any disclaimer, the term of this patent is extended or adjusted under 35 U.S.C. 154(b) by 0 days.

(21) Appl. No.: 14/080,359

(22) Filed: Nov. 14, 2013

(65) Prior Publication Data

US 2015/0129838 A1    May 14, 2015

(51) Int. Cl.
*H01L 31/02*  (2006.01)
*H01L 31/0352*  (2006.01)
*H01L 31/18*  (2006.01)

(52) U.S. Cl.
CPC ........ *H01L 31/035218* (2013.01); *H01L 31/18* (2013.01)

(58) Field of Classification Search
CPC ... H01L 31/02; H01L 51/426; H01L 51/0094; H01L 51/0036
USPC .......................................................... 257/21
See application file for complete search history.

(56) References Cited

U.S. PATENT DOCUMENTS

| | | | |
|---|---|---|---|
| 8,574,685 B1 | 11/2013 | Lewis et al. | |
| 2013/0026445 A1* | 1/2013 | Parsapour | 257/13 |

OTHER PUBLICATIONS

Baik et. al., Low-Temperature Annealing for Highly Conductive Lead Chalcogenide Quantum Dot Solids, J. Phys. Chem. C. 2011, 115, 607-612.
Bealing, et. al., Predicting Nanocrystal Shape through Consideration of Surface-Ligand Interactions, ACS Nano. 2012, 6, 21118-27.
Beard, Multiple Exciton Generation in Semiconductor Quantum Dots, J. Phys. Chem. Lett. 2011, 2, 1282-1288.
Bian, et.al., Shape-Anisotropy Driven Symmetry Transformations in Nanocrystal Superlattice Polymorphs, ACS NANO. 2011, 5, 2815-2823.
Choi, et.al., Controlling Nanocrystal Superlattice Symmetry and Shape-Anisotropic Interactions through Variable Ligand Surface Coverage, J. Am. Chem. Soc. 2011, 133, 3131-3138.
Clark, et. al., Resonant Energy Transfer in PbS Quantum Dots. J. Phys. Chem. C 2007, 111, 7302-7305.
Chou, et. al., Metal-oxide interconnection layer for polymer tandem solar cells with an inverted architecture. Adv. Mater. 2011, 23, 1282-1286.

(Continued)

*Primary Examiner* — Mark Tornow
(74) *Attorney, Agent, or Firm* — Robert J. Varkonyi; Smith & Hopen, P.A.

(57) ABSTRACT

Manipulation of the passivation ligands of colloidal quantum dots and use in QD electronics. A multi-step electrostatic process is described which creates bare QDs, followed by the formation of QD superlattice via electric and thermal stimulus. Colloidal QDs with original long ligands (i.e. oleic acid) are atomized, and loaded into a special designed tank to be washed, followed by another atomization step before entering the doping station. The final step is the deposition of bare QDs onto substrate and growth of QD superlattice. The method permits the formation of various photonic devices, such as single junction and tandem solar cells based on bare QD superlattice, photodetectors, and LEDs. The devices include a piezoelectric substrate with an electrode, and at least one layer of bare quantum dots comprising group IV-VI elements on the electrode, where the bare quantum dots have been stripped of outer-layer ligands.

10 Claims, 21 Drawing Sheets

(56) References Cited

OTHER PUBLICATIONS

Corricelli et.al., Near Infrared Emission from Monomodal and Bimodal PbS Nanocrystal Superlattices, J. Phys. Chem. C. 2012, 116, 6143-6152.

Decher, Fuzzy Nanoassemblies: Toward Layered Polymeric Multicomposites, Science, 1997; 277(5330), 1232-1237.

Dou, et. al., Tandem polymer solar cells featuring a spectrally matched low-bandgap polymer. Nat. Phonton. 6(3), 180-185.

Ellingson, et. al., Highly Efficient Multiple Exciton Generation in Colloidal PbSe and PbS Quantum Dots, Nano letters. 2005, 5, 865-871.

Hanrath, et. al., PbSe Nanocrystal Network Formation during Pyridine Ligand Displacement, ACS Applied Materials & Interfaces. 2009, 1, 244.

Ip, et al., Hybrid passivated colloidal quantum dot solids, Nat Nanotechnol, 2012; 7, 577-582.

Johnston, et. al., Schottky-quantum dot photovoltaics for efficient infrared power conversion, Appl. Phys. Lett. 2008, 92, 151115.

Klar, et. al., Super efficient exciton funneling in LbL semiconductor structures, J. Adv. Mater. 2005, 17, 769-773.

Konstantatos, et. al., Ultrasensitive solution-cast quantum dot photodetectors, Nature. 2006, 442, 180-183.

Law, et. al., Structural, Optical, and Electrical Properties of PbSe Nanocrystal Solids Treated Thermally or with Simple Amines. J. Am. Chem. Soc. 2008, 130, 5974-5985.

Lobo, et. al., Photoelectron Spectroscopic Investigations of Chemical Bonding in Organically Stabilized PbS Nanocrystals, J. Phys. Chem. B. 2005, 109, 17422-17428.

Lü, et. al., Temperature dependence of electronic energy transfer in PbS quantum dot films. App. Phys. Lett. 2009, 95 (8), 083102(1)-083102(3).

Ma, et. al., Photovoltaic Performance of Ultrasmall PbSe Quantum Dots. ACS Nano, 5, 8140-8147, 2011.

Mahawela, et al., Transparent high-performance CdSe thin-film solar cells, Thin Solid Films. 2005, 480-481,466-470.

Mentzel, et. al., Charge transport in PbSe nanocrystal arrays, Phys. Rev. B 2008, 77, 075316.

Minden, Effects of Oxygen on PbS Films, J. Chem. Phys. 23, 1948-1955 (1955).

Murray & Bawendi, Synthesis and characterization of nearly monodisperse CdE (E = sulfur, selenium, tellurium) semiconductor nanocrystallites. J.Am.Chem.Soc., 1993. 115: p. 8706.

Murray, et al., Synthesis and Characterization of Monodisperse Nanocrystals and Close-packed Nanocrystal Assemblies, Annu. Rev. Mater. Sci. 2000, 30, 545-610.

Murray, et al., Colloidal synthesis of nanocrystals and nanocrystal superlattices. Ibm Journal of Research and Development, 2001. 45(1): p. 47-56.

Pandey & Guyot-Sionnest, Slow Electron Cooling in Colloidal Quantum Dots. Science. 2008, 322, 930-932.

Peng et.al., Heterogeneous confinement in laterally coupled InGaAs/GaAs quantum dot molecules under lateral electric fields., Phys. Rev. B 2010, 83(20), 205315-17.

Pietryga, et al., Pushing the band gap envelope: Mid-infrared emitting colloidal PbSe quantum dots. Journal of the American Chemical Society, 2004. 126(38): p. 11752-11753.

Rinnerbauer, et. al., Energy transfer in close-packed PbS nanocrystal films. Phys. Rev. B 2008, 77(8), 085322(1)-085322(9).

Romero & Drndic, Coulomb Blockade and Hopping Conduction in PbSe Quantum Dots, Phys. Rev. Lett. 2005, 95, 156801.

Sarasqueta , et al., Organic and inorganic Blocking Layers for Solution-Processed Colloidal PbSe Nanocrystal Infrared Photodetectors. Adv. Funct. Mater. 2011, 21, 167-171.

Schaller & Klimov, High Efficiency Carrier Multiplication in PbSe Nanocrystals: Implications for Solar Energy Conversion, Phys. Rev. Lett. 2004, 92, 186601-4.

Semonin, et al., Peak External Photocurrent Quantum Efficiency Exceeding 100% via Meg in a Quantum Dot Solar Cell, Science. 2011, 334, 1530).

Seo, et. al., Enhancement of the photovoltaic performance in PbS nanocrystal:P3HT hybrid composite devices by posttreatment-driven ligand exchange , Nanotechnol. 2009 20, 095202.

Stouwdam, et. al., Photostability of Colloidal PbSe and PbSe/PbS Core/Shell Nanocrystals in Solution and in the Solid State, J. Phys. Chem. C. 2007, 111, 1086-1092.

Talapin & Murray, PbSe Nanocrystal Solids for n- and p-Channel Thin Film Field-Effect Transistors, Science. 2005, 310, 86-89.

Talapin, et. al., Dipole-Dipole Interactions in Nanoparticle Superlattices, Nano Lett. 2007, 7, 1213-1219.

Tang, et. al., Colloidal-quantum-dot photovoltaics using atomic-ligand passivation. Nature Mater. 2011 10, 765-771.

Tisdale, et. al., Hot-Electron Transfer from Semiconductor Nanocrystals. Science. 2010, 328, 1543-1547.

Urban, et. al., Self-Assembly of PbTe Quantum Dots into Nanocrystal Superlattices and Glassy Films. J. Am. Chem. Soc. 2006, 128, 3248-3255.

van Huis, et. al., Low-Temperature Nanocrystal Unification through Rotations and Relaxations Probed by in Situ Transmission Electron Microscopy. Nano Lett. 2008, 8(11), 3959-3963.

Yu, et al., Preparation and characterization of monodisperse PbSe semiconductor nanocrystals in a noncoordinating solvent. Chem. Mater, 2004. 16: p. 3318.

Turyanska, L. et al., Tailoring the physical properties of thiol-capped PbS quantum dots by thermal annealing. Nanotechnology 20 (2009) 315604 (5pp). Downloaded on Mar. 26, 2015.

\* cited by examiner

A

B

C

D

BARE QUANTUM DOTS SUPERLATTICE PHOTONIC DEVICES

FIELD OF INVENTION

This invention relates to the quantum dot films. Specifically, the invention provides for quantum dot ligand manipulation, and formation of superlattice film by multi-step electrostatic deposition technique.

BACKGROUND OF THE INVENTION

More energy from the sun strikes the Earth in one hour than all the energy consumed on the planet in one year, yet solar electricity accounts for less than 0.02% of all electricity produced worldwide. The enormous gap between the potential of solar energy and its use is due, in part, to the cost/conversion capacity. The development of third generation solar cells (high efficiency plus low cost) is of paramount importance to both humanity and nature.

Solution-processability has been recognized as a feasible solution to cost issues, and novel mechanisms such as carrier multiplication a possible route to achieve higher efficiency levels. In both these aspects, there is potential in colloidal infrared quantum dots, such as lead selenide (PbSe) and lead sulfide (PbS).

Quantum dots (QDs) are nanocrystals, consisting of tens to hundreds of atoms, whose size is smaller than its bulk exciton Bohr radius (46 nm for PbSe and 18 nm for PbS), as seen in FIG. 1(B). Due to the nanocrystal's small size (smaller than the exciton Bohr radius of the bulk semiconductor), strong quantum confinement results in discrete energy levels and a larger bandgap than the respective bulk semiconductor, as seen in FIG. 2. The first excitonic transition (E1) from 1Sh to 1Se defines the optical band gap Eg of a nanocrystal. For PbSe QDs, depending on the size, their bandgap energies can be tuned from 0.5 eV to 1.2 eV, as seen in FIG. 3 (Murray & Bawendi, Synthesis and characterization of nearly monodisperse CdE (E=sulfur, selenium, tellurium)semiconductor nanocrystallites. J. Am. Chem. Soc., 1993. 115: p. 8706; Murray, et al., *Colloidal synthesis of nanocrystals and nanocrystal superlattices*. Ibm Journal of Research and Development, 2001. 45(1): p. 47-56; Pietryga, et al., *Pushing the band gap envelope: Mid-infrared emitting colloidal PbSe quantum dots*. Journal of the American Chemical Society, 2004. 126 (38): p. 11752-11753; Yu, et al., Preparation and characterization of monodisperse PbSe semiconductor nanocrystals in a noncoordinating solvent. Chem. Mater, 2004. 16: p. 3318; Murray, et al., "Synthesis and Characterization of Monodisperse Nanocrystals and Close-packed Nanocrystal Assemblies", Annu Rev. Mater. Sci. 2000, 30, 545-610). Infrared QDs such as PbSe and PbS synthesized via a solution-based procedure provide an alternative platform for low cost photonic devices. Near infrared colloidal QD photodetector offers higher sensitivity than its bulk materials due to the narrow D* spectrum (Konstantatos, et. al., Ultrasensitive solution-cast quantum dot photodetectors, Nature. 2006, 442, 180-183). The electroluminescent powers of the best PbS QD LEDs were comparable to commercial products (Sun, et al., Bright infrared quantum-dot light-emitting diodes through inter-dot spacing control, Nat. Nanotechol. 2012, 7, 369-373). PbSe and PbS QDs have generated particularly strong research interest in photovoltaic applications, due in part to the discovery of multiple exciton generation (MEG) that possibly could boost QD solar cell efficiency (Schaller & Klimov, High Efficiency Carrier Multiplication in PbSe Nanocrystals: Implications for Solar Energy Conversion, Phys. Rev. Lett. 2004, 92, 186601-4; Ellingson, et al., Highly Efficient Multiple Exciton Generation in Colloidal PbSe and PbS Quantum Dots, Nano letters. 2005, 5, 865-871; Beard, Multiple Exciton Generation in Semiconductor Quantum Dots, J. Phys. Chem. Lett. 2011, 2, 1282-1288). MEG based solar cells were fabricated and the effect confirmed in recent reports (Semonin, et al., Peak External Photocurrent Quantum Efficiency Exceeding 100% via MEG in a Quantum Dot Solar Cell, Science. 2011, 334, 1530). Despite its poor initial power conversion value of <0.01% in efficiency in QD hybrid solar cell with polymers in 2004 (McDonald, et al., *Solution-processed PbS quantum dot infrared photodetectors and photovoltaics*, Nature Materials. 2004, 4, 138-142), followed by years of faltered faith in this class of materials due to the frustration with MEG phenomenon (Nair, et al., Carrier multiplication yields in PbS and PbSe nanocrystals measured by transient photoluminescence, Physical Review B. 2008, 78 (12), 125325; McGuire, et al., *New Aspects of Carrier Multiplication in Semiconductor Nanocrystals*, Accounts of Chemical Research. 2008, 41 (12), 1810-1819; Pijpers, et al., Assessment of carrier-multiplication efficiency in bulk PbSe and PbS, Nature Physics. 2009, 5, 811) and declined research interest partially because of the disappointing results on QD hybrid solar cells (Maria, et al., Solution-processed infrared photovoltaic devices with >10% monochromatic internal quantum efficiency, Appl. Phys. Lett. 2005, 87, 213112-213112; Watt, et al., Lead sulfide nanocrystal: conducting polymer solar cells, J. Phys. D. 2005, 38, 2006-2012; Jiang, et al., Nanocomposite Solar Cells Based on Conjugated Polymer/PbSe Quantum Dot, Proc. Of SPIE. 2005, 5938, 59381F-1; Gunesac, et al., *Hybrid solar cells using PbS nanoparticles*, Solar Energy Materials & Solar Cells. 2007, 91, 420-423), in 2012 a record of 7.4% power conversion efficiency PbS QD solar cell was reported (Ip et. al., *Hybrid passivated colloidal quantum dot solids*, Nature Nanotechnol. 2012, 7, 577-582), a value that is close to commercially viable products.

Despite being one of the most promising solutions for solar energy utilization, the present performance of such infrared quantum dot-based PV devices are far from their expectations. The two major causes for their relatively low efficiency have been recognized in current research; inefficient exciton separation at the quantum dot/constituent interface and poor charge percolation pathways to the extracting electrodes. Efficient photo-induced charge transfer has not been observed in quantum dot composites, due largely to the lack of a measurement technique which would allow a clear separation between exciton dissociation and charge transport phenomena. This makes it challenging to gain detailed insight into either phenomenon, impeding rational design of absorber layers. Furthermore, the majority of the transport studies so far have been limited to the planar structure field effect transistors (FET), whereas an applicable quantum dot photovoltaic (PV) device is of sandwich structure, and it is known that the transport characteristics could be very different in these two structures.

The common breakthrough in all three types of photonic devices was ligand manipulation. During the colloidal synthesis process, certain ligands (usually TOPO or oleic acid) are used to passivate quantum dot surfaces to prevent aggregations. The as-synthesized PbSe QDs are practically insulators due to the original bulky passivation ligands, such a oleic acids depicted in FIG. 1(A), which are used to separate QDs. These ligands are barriers in electronic processes such as exciton dissociation, charge transfer and transport. Incomplete passivation results in surface trap sites, with the bulky ligands serving as barriers for exciton dissociation at the quantum dot/constituent interface, thereby hindering photo-induced charge transfer (PCT). The addition of quantum dots without the optimization of their interfaces with other constituent(s)—i.e., without the formation of separate percolation pathways for electrons—e and holes—h—causes huge loss of the photo-generated free carriers due to e-h recombination. Thus, to break through the present technology limitations, these ligand barriers must be reduced while making QDs electronically coupled.

Conventionally, post-synthesis treatments, including chemical and thermal treatments, have proven to be efficient to enhance quantum dot transport properties. Usual chemical treatments include ligand exchange in solution prior to film formation and ligand condensation or removal on films. Remarkable increases in film conductivity and mobility have been achieved by hydrazine treatment and EDT (1,2-ethanedithiol) soaking (Talapin & Murray, PbSe Nanocrystal Solids for n- and p-Channel Thin Film Field-Effect Transistors, Science. 2005, 310, 86-89; Luther, et. al., Structural, Optical, and Electrical Properties of Self-Assembled Films of PbSe Nanocrystals Treated with 1,2-Ethanedithiol, ACS Nano. 2008, 2, 271-280).

Improved infrared response in PbS quantum dot photovoltaic devices and photoconductors has been demonstrated after ligand exchange with butylamine (Johnston, et. al., Schottky-quantum dot photovoltaics for efficient infrared power conversion, Appl. Phys. Lett. 2008, 92, 151115). Moreover, photodetection at SWIR wavelength of 1.3 µm with a normalized detectivity $(D^*)>s10^{13}$ jones has been demonstrated with butylamine-exchanged PbS NCs (Konstantatos, et. al., Ultrasensitive solution-cast quantum dot photodetectors, Nature. 2006, 442, 180-183).

However, there are serious limitations related to conventional treatments. Firstly, the high $D^*$ (Konstantatos, et. al., Ultrasensitive solution-cast quantum dot photodetectors, Nature. 2006, 442, 180-183) had to be compromised by a slow response (hundreds of milliseconds) due mainly to the deep trap states brought in by chemical treatments. Secondly, ligand exchange is very hard to control, and usually it ends up with partial exchange and loss of free volume leading to development of cracks in the nanocrystal films (Konstantatos, et. al., Ultrasensitive solution-cast quantum dot photodetectors, Nature. 2006, 442, 180-183; Seo, et. al., Enhancement of the photovoltaic performance in PbS nanocrystal:P3HT hybrid composite devices by post-treatment-driven ligand exchange, Nanotechnol. 2009 20, 095202; Hanrath, et. al., PbSe Nanocrystal Network Formation during Pyridine Ligand Displacement, ACS Applied Materials & Interfaces. 2009, 1, 244). Thirdly, ligand removal processes involve very harmful chemicals such as hydrazine, and are not practical with solution processes since the ligands removal is performed on QD film. Thermal treatments have shown to improve carrier mobility and conductance (Romero & Drndic, Coulomb Blockade and Hopping Conduction in PbSe Quantum Dots, Phys. Rev. Lett. 2005, 95, 156801; Law, et. al., Structural, Optical, and Electrical Properties of PbSe Nanocrystal Solids Treated Thermally or with Simple Amines. J. Am. Chem. Soc. 2008, 130, 5974-5985; Mentzel, et. al., Charge transport in PbSe nanocrystal arrays, Phys. Rev. B 2008, 77, 075316; Urban, et. al., Self-Assembly of PbTe Quantum Dots into Nanocrystal Superlattices and Glassy Films. J. Am. Chem. Soc. 2006, 128, 3248-3255), however, temperature elevation was shown to cause desorption of ligands, and the presence of large organic ligands after thermal annealing may increase the density of trap sites and prevent the ordered arrangement of QDs (Baik et. al., Low-Temperature Annealing for Highly Conductive Lead Chalcogenide Quantum Dot Solids, J. Phys. Chem. C. 2011, 115, 607-612; van Huis, et. al., Low-Temperature Nanocrystal Unification through Rotations and Relaxations Probed by in Situ Transmission Electron Microscopy. Nano Lett. 2008, 8(11), 3959-3963), which would cause a decrease in carrier lifetime and mobility (Tisdale, et. al., Hot-Electron Transfix from Semiconductor Nanocrystals. Science. 2010, 328, 1543-1547; Pandey & Guyot-Sionnest, Slow Electron Cooling in Colloidal Quantum Dots. Science. 2008, 322, 930-932). Furthermore, there was evidence showing that thermal treatment caused the QDs to lose their crystalline features (Law, et. al., Structural, Optical, and Electrical Properties of PbSe Nanocrystal Solids Treated Thermally or with Simple Amines. J. Am. Chem. Soc. 2008, 130, 5974-5985; Mentzel, et. al., Charge transport in PbSe nanocrystal arrays, Phys. Rev. B 2008, 77, 075316; Urban, et. al., Self-Assembly of PbTe Quantum Dots into Nanocrystal Superlattices and Glassy Films. J. Am. Chem. Soc. 2006, 128, 3248-3255).

Recently, promising results on QD solar cells have been achieved by using short ligands during the synthesis process, including use of atomic ligand passivation (Tang, et. al., Colloidal-quantum-dot photovoltaics using atomic-ligand passivation. Nature Mater. 2011 10, 765-771), and the use of hybrid passivation ligands (Talapin & Murray, PbSe Nanocrystal Solids for n-and p-Channel Thin Film Field-Effect Transistors, Science. 2005, 310, 86-89). Power conversion efficiency in the range of 3.5~4.6% has been reported with very small PbSe QD (<2 nm) solar cells (Ma, et. al., Photovoltaic Performance of Ultrasmall PbSe Quantum Dots. ACS Nano, 5, 8140-8147, 2011). Yet, comparing with the original simple synthesis route using oleic acid or TOPO as passivation layers (Yu, et al., Preparation and characterization of monodisperse PbSe semiconductor nanocrystals in a noncoordinating solvent. Chem. Mater, 2004. 16: p. 3318; Murray, et al., "Synthesis and Characterization of Monodisperse Nanocrystals and Close-packed Nanocrystal Assemblies", Annu Rev. Mater. Sci. 2000, 30, 545-610), these new synthesis processes, such as hybrid passivation synthesis of QDs, are more complex and harder to control. (Ip, et al., Hybrid passivated colloidal quantum dot solids, Nat Nanotechnol, 2012; 7, 577-582), due to the unspecified 'hard to access sites' in solution phase, and the complexity of using 'bidentate organic linkers' during film formation phase.

The addition of surface passivized quantum dots to present cost-effective organic solar materials (i.e., polymers) could double power conversion efficiency to twelve percent due to the infrared absorbers' enhanced spectrum match with sunlight. Initial observation of carrier multiplication and recent confirmation of it in these quantum dots holds fundamental importance in current solar cell development. Ligands are hindrance of QD devices. It is necessary to have surface passivation during colloidal synthesis process. However, an innovative method is called to for a complete elimination of ligands in QD devices.

SUMMARY OF INVENTION

QD film morphology plays an essential role in device performance. Highly ordered arrangement among QDs, or QD arrays, is desirable both in terms of lower trap density and higher carrier mobility. It was shown in the high efficiency QD solar cell using hybrid ligands that the trap density was 5× lower than that in conventional ligands and the crystallinity of film is also better (Ip et. al., Hybrid passivated colloidal quantum dot solids, Nature Nanotechnol. 2012, 7, 577-582). Due to the nature of discrete energy structure, the transport mechanism in even the disordered 2D arrays is still hopping.

It is predicted that the formation of 'miniband' (a set of delocalized, extended states from individual QD levels) is possible in Si QDs (Smith & Nozik, *Theoretical Studies of Electronic State Localization and Wormholes in Silicon Quantum Dot Arrays*. J. Nano Lett. 2001, 1(1), 36-41). In this case, a much improved band-like transport behaviors will be expected (Nozik, et al., *Semiconductor Quantum Dots and Quantum Dot Arrays and Applications of Multiple Exciton Generation to Third-Generation Photovoltaic Solar Cells*. Chem. Rev. 2010, 110, 6873-6890).

Where QDs form superlattice in the aforementioned solar cell architecture, higher efficiency is expected. Comparing to the relatively well-studied case with amorphous QD arrangement (Pietryga, et al., *Pushing the band gap envelope: Mid-infrared emitting colloidal PbSe quantum dots*. Journal of the American Chemical Society, 2004. 126(38): p. 11752-11753; Zhang & Jiang, Confinement-Dependent Below-Gap State in PbS Quantum Dot Films Probed by Continuous-Wave Photoinduced Absorption, J. Phys. Chem. B. letter. 2008, 112, 9557-9560; Kang & Wise, Electronic structure and optical properties of PbS and PbSe quantum dots, J. Opt. Soc. Am. B. 1997, 14, 1632-1646; Wehrenberg, et. al., Interband and Intraband Optical Studies of PbSe Colloidal Quantum Dots, J. Phys. Chem. B. 2002, 106, 10634-10640; Fernee &. Rubinsztein-Dunlop, Highly efficient luminescence from a hybrid state found in strongly quantum confined PbS nanocrystals, Nanotechno. 2006, 17, 956-962; Klimov, Spectral and Dynamical Properties of Multiexcitons in Semiconductor Nanocrystals, Annu Rev. Phys. Chem. 2007, 58, 635-673; Zhang & Jiang, Steady state photoinduced absorption of PbS quantum dots film, Appl. Phys. Lett. 2008, 92, 141108; An, et. al., The Excitonic Exchange Splitting and Radiative Lifetime in PbSe Quantum Dots, Nano Letts. 2007, 7, 2129-2135; Allan & Delerue, *Unusual quantum confinement effects in IV-VI materials*, Materials Science and Engineering C. 2005, 25, 687-690; Wehrenberg, et. al., *Conduction in Charged PbSe Nanocrystal Films*, J. Phys. Chem. B. 2005, 109, 20192-20199), relatively sparse research is dedicated to find out the mechanism of QD superlattice formation and its effect on electronic states structure. This is in part owing to the inherent complexity of QD self-assembly process. Several interactions (QD-QD, QD-ligand, QD-solvent) have to be dynamically balanced during the assembling process (Choi, et. al., *Controlling Nanocrystal Superlattice Symmetry and Shape-Anisotropic Interactions through Variable Ligand Surface Coverage*, J. Am. Chem. Soc. 2011, 133, 3131-3138). Even in the simplest scenario, assuming the spherical shape of QDs, a closed-packed structure (such as fcc or hcp) is expected for QD assembly. Therefore the break of spherical symmetry could create other open-packed crystal structures such as bcc or sc (Talapin, et. al., *Dipole-Dipole Interactions in Nanoparticle Superlattices*, Nano Lett. 2007, 7, 1213-1219). The key to guide QD assembly is to introduce some perturbation via different ways, such as solvent vapor processing (Corricelli et. al., *Near Infrared Emission from Monomodal and Bimodal PbS Nanocrystal Superlattices*, J. Phys. Chem. C. 2012, 116, 6143-6152), drop-casting (Clark, et. al., *Resonant Energy Transfer in PbS Quantum Dots*. J. Phys. Chem. C 2007, 111, 7302-7305; Lü, et. al., *Temperature dependence of electronic energy transfer in PbS quantum dot films*. App. Phys. Lett. 2009, 95(8), 083102(1)-083102(3)), spin-coating (Rinnerbauer, et. al., *Energy transfer in close-packed PbS nanocrystal films*. Phys. Rev. B 2008, 77(8), 085322(1)-085322(9)) and electrostatic layer-by-layer deposition (Klar, et. al., *Super efficient exciton funneling in LbL semiconductor structures*, J. Adv. Mater. 2005, 17, 769-773; Peng et. al., *Heterogeneous confinement in laterally coupled InGaAs/GaAs quantum dot molecules under lateral electric fields*., Phys. Rev. B 2010, 83(20), 205315-17).

Recent work from a group in Cornell University has shown that the ligand surface coverage determines the shape of QDs therefore the symmetry of QD superlattice (Choi, et. al., *Controlling Nanocrystal Superlattice Symmetry and Shape-Anisotropic Interactions through Variable Ligand Surface Coverage*, J. Am. Chem. Soc. 2011, 133, 3131-3138; Bian, et. al., Shape-Anisotropy Driven Symmetry Transformations in Nanocrystal Superlattice Polymorphs, ACS NANO. 2011, 5, 2815-2823; Bealing, et. al., *Predicting Nanocrystal Shape through Consideration of Surface-Ligand Interactions*, ACS Nano. 2012, 6, 21118-27). At the same time, IBM group has shown that PbS QDs can form nonclose-packed simple-hexagonal (sh), fcc or hcp structure superlattices depending on the dipolar interaction strength (Talapin, et. al., *Dipole-Dipole Interactions in Nanoparticle Superlattices*, Nano Lett. 2007, 7, 1213-1219). However, none of these methods are for bare QDs, and the drastic change in surface conditions could bring in completely different results on QD superlattice properties. Furthermore, even for ligand-QD superlattice, existing results are mainly on the structural study, and the systematic probe on optical and transport properties of QD superlattice, and correlation between device performances are still missing.

In the case of QD solar cell, another issue is the device design, which includes the photoactive layer and device architecture. Through many futile attempts to drastically improve the efficiency of hybrid solar cell-photoactive layer consisting of organic polymer as electron donor and inorganic QDs as electron acceptor, this design rule has turned out to be intrinsically defective due mainly to the large mismatch of bandgaps, and inefficient charge transfer between donor and acceptor (Moulè, et al., *Hybrid solar cells: basic principles and the role of ligands*, J. Mater. Chem., 2012, 22, 2351). Instead of using the BHJ structure which was proven to be successful with organic photovoltaics, Schottky diode structure was used to help sweep out minority carriers (Luther, et. al., *Schottky Solar Cells Based on Colloidal Nanocrystal Films*, Nano Lett. 2008, 8, No. 10, 3488-3492). In 2010, the efficiency of PbS QD solar cells using Schottky structure have seen the efficiency over 4% (Ma, et. al., *Photovoltaic Performance of Ultrasmall PbSe Quantum Dots*. ACS Nano, 5, 8140-8147, 2011; ref. 5.6%, Liu, et al., *Electron acceptor materials engineering in colloidal quantum dot solar cells*. Adv. Mater. 2011, 23, 3832-3837), most recently the use of depleted-heterojunction has achieved device efficiency over 7% (Ip et. al., *Hybrid passivated colloidal quantum dot solids*, Nature Nanotechnol. 2012, 7, 577-582).

Naturally PbSe and PbS QDs have the tendency of being oxidized and becoming p-type. The formation of Schottky junction is due to these oxidized defects (usually PbO). The revolution of Si solar cell comes from the use of a pn junction structure, therefore it will be beneficial to dope QDs into n-type and p-type, and create p-n junction QD solar cell.

A multi-step electrostatic process is described which creates bare QDs, followed by the formation of QD superlattice via electric and thermal stimulus. Colloidal QDs with original long ligands (i.e. oleic acid) are atomized, and loaded into a special designed tank to be washed, followed by another atomization step before entering the doping station. The final step is the deposition of bare QDs onto substrate and growth of QD superlattice. The method permits the formation of various photonic devices, such as single junction and tandem solar cells based on bare QD superlattice, photodetectors, and LEDs.

The method provides a ligated quantum dots comprising group IV-VI elements. Examples of group IV-VI elements are PbTe, PbSe, PbSe—PbTe, SbTe$_2$—PbTe, AgSbTe$_2$—PbSe, alloys of PbTe and PbSe, PbSn$_x$Se$_{1-x}$, or combinations of the aforementioned compounds. Chalcogenide-based materials, such as PbTe, are useful. In certain embodiments, the Group IV-VI materials are chalcogenide. These chalcogenide materials are optionally nanoparticles of highly crystal grains, and may specifically be between 1 and 100 nm. The chalcogenide nanoparticles may be Bi$_2$Te$_3$, Sb$_2$Te$_3$, PbSeTe, PbTe, CdS CdSe, ZnSe, ZnS, CsS, PbS, or PbSe$_x$S$_{1-x}$. In specific embodiments, the nanocrystals are PbTe particles ranging in size from 100-150 nm.

The ligated quantum dots were atomized. The atomization was performed with a transducer or ultrasonic vibration device, however other means known in the art may also be used. The atomization was optionally performed in toluene Optionally, the quantum dots were placed in n-butyl alcohol prior to washing. This was accomplished by washing the ligand from the quantum dots by placing the quantum dots into a washing apparatus, and adding a wash solution, such as methanol, to the washing apparatus. The washing apparatus used comprises a cylindrical mixing unit, having a top wall, a bottom wall and tubular side wall, a quantum dot solution input disposed in the top half of the mixing unit, an agitator blade disposed on the bottom wall, and a quantum dot solution output disposed in the bottom half of the mixing unit. The quantum dots were then subjected to shearing forces formed by the washing apparatus, thereby removing the ligands from the quantum dots. The stripped quantum dots, i.e. quantum dots without ligand, were then atomized. The resulting atomized quantum dots were doped.

Doping was accomplished by introducing the atomized quantum dots to an electrolyte solution, a replacement ion, or an electrical charge.

Where the electrolyte solution is used, the quantum dots are introduced into an electrolyte introduction apparatus along with an electrolyte solution. Non-limiting examples of electrolyte solution are poly(allylamine hydrochloride), 2-mercaptoethylamine, poly(styrene sulfonate), and thioglycolic acid. The apparatus includes a cylindrical mixing unit, having a top wall, a bottom wall and tubular side wall with a quantum dot solution input disposed in the top half of the mixing unit. An agitator blade disposed on the bottom wall and a quantum dot solution output disposed in the bottom half of the mixing unit. The quantum dots were then subjected to shearing forces formed by the electrolyte introduction apparatus, thereby introducing the electrolyte.

Where the replacement ion is used, the quantum dots are introduced into an ion exchange apparatus. The apparatus includes a cylindrical mixing unit, having a top wall, a bottom wall and tubular side wall with an agitator blade disposed on the bottom wall. A quantum dot solution input disposed in the top half of the mixing unit and a quantum dot solution output disposed in the bottom half of the mixing unit. The ion exchange solution, such as a metal halide in a solution, was added to the ion exchange apparatus and the quantum dots subjected to shearing forces formed by the electrolyte introduction apparatus. Optionally, the ionic solvent of the ion exchange solution is washed off in a bath of deionized (DI) water Where the electrical charge is used, the quantum dots were subjected to alternating positive and negative surface charges on the bare quantum dots electrochemically or electrically.

The doped quantum dots were transferred to a deposition spray device, and applied to a piezoelectric substrate, using spraying or charged deposition. The charged deposition is performed by applying a charge to the quantum dots in the atomizer, on the spray head of the atomizer, or a combination thereof, applying a reverse charge to the piezoelectric substrate, and spraying the charged quantum dots at the piezoelectric substrate, thereby causing the quantum dots to attract to the piezoelectric substrate. Optionally, the surface charge on the bare quantum dots is provided by a charge plate disposed in a quantum dot holding container or atomizer spray head. The quantum dots were then annealed to the piezoelectric substrate to form a bare quantum dot superlattice, wherein the annealing is performed using an alternating electric current, a direct current, thermal modulation, or a combination thereof.

Also disclosed are thin film devices, having a piezoelectric substrate with an upper face and a lower face. Non-limiting examples are glass, quartz, plastic, polyethylene terephthalate, high density polyethylene, polyvinyl chloride, polypropylene, polystyrene, polyethylene, high impact polystyrene, low density polyethylene, polycarbonate, polyamide, and polyurethane. A first electrode, such as indium tin oxide, indium tin oxide, zinc oxide, or a titanium oxide, is disposed on the upper face of the substrate. Optionally, a PEDOT:PSS or $ZnO/TiO_2$ layer is disposed on the first electrode.

At least one layer of bare quantum dots comprising group IV-VI elements is disposed on the electrode. In certain embodiments, a thermoelectric element composed of Groups IV-VI material. For example, chalcogenide-based materials, such as PbTe, are useful. In certain embodiments, the Group IV-VI materials are chalcogenide. These chalcogenide materials are optionally nanoparticles of highly crystal grains, and may specifically be between 1 and 100 nm. The chalcogenide nanoparticles may be $Bi_2Te_3$, $Sb_2Te_3$, PbSeTe, PbTe, CdS CdSe, ZnSe, ZnS, CsS, PbS, or $PbSe_xS_{1-x}$. In specific embodiments, the nanocrystals are PbTe particles ranging in size from 100-150 nm.

Examples of group IV-VI elements are PbTe, PbSe, PbSe—PbTe, $SbTe_2$—PbTe, $AgSbTe_2$—PbSe, alloys of PbTe and PbSe, $PbSn_xSe_{1-x}$, or combinations of the aforementioned compounds. The quantum dots of the present invention have been stripped of outer-layer ligands, thereby forming a thin and smooth film that enhances photo. In some variations, the layer or layers of bare quantum dots comprises a single-size multi-layer $A_n$, or an alternating multi-layer in the combination of $A_nB_m$. Where the layer is an alternating layer of $A_nB_m$, A and B are different sized quantum dots, and n and m are indices for the repeating pattern of the quantum dots. The quantum dot layer may include at least one alternating layer of n-type bare quantum dots and p-type bare quantum dots. Optionally, a hole transport layer is disposed on the at least one layer of bare quantum dots. Exemplary materials for the hole transport layer are PEDOT:PSS, LiF, $MoO_3$, MoOx, or ZnSe/ZnTe. Alternatively, a ZnO layer disposed on the at least one layer of bare quantum dots.

A second electrode, such as aluminum or gold, disposed on the upper face of the at least one layer of bare quantum dots, wherein the first electrode and second electrode have different polarities.

In specific variations, the device uses a hole transport layer of $MoO_3$ or PEDOT:PSS, and has an indium tin oxide first electrode, a $ZnO/TiO_2$ or ZnO layer disposed on the first electrode, and a second electrode further comprises gold of silver.

BRIEF DESCRIPTION OF THE DRAWINGS

For a fuller understanding of the invention, reference should be made to the following detailed description, taken in connection with the accompanying drawings, in which:

FIGS. 1(A) and (B) show illustrations of a PbSe quantum dot (QD). (A) an illustration of a quantum dot with oleic acid ligand surrounding the QD structure; (B) a rock salt crystal structure of PbSe nanocrytal forming the QD.

FIGS. 10(A) and (B) show illustration of a quantum dot with oleic acid ligand surrounding the QD structure before (left) and after (right) electrically treating QD films. (A) A single QD dot before (left) and after (right) electrical charge; and (B) closer packed QDs in the electrically treated film comparing with untreated film has shorter transport path vertically.

Figure 11:
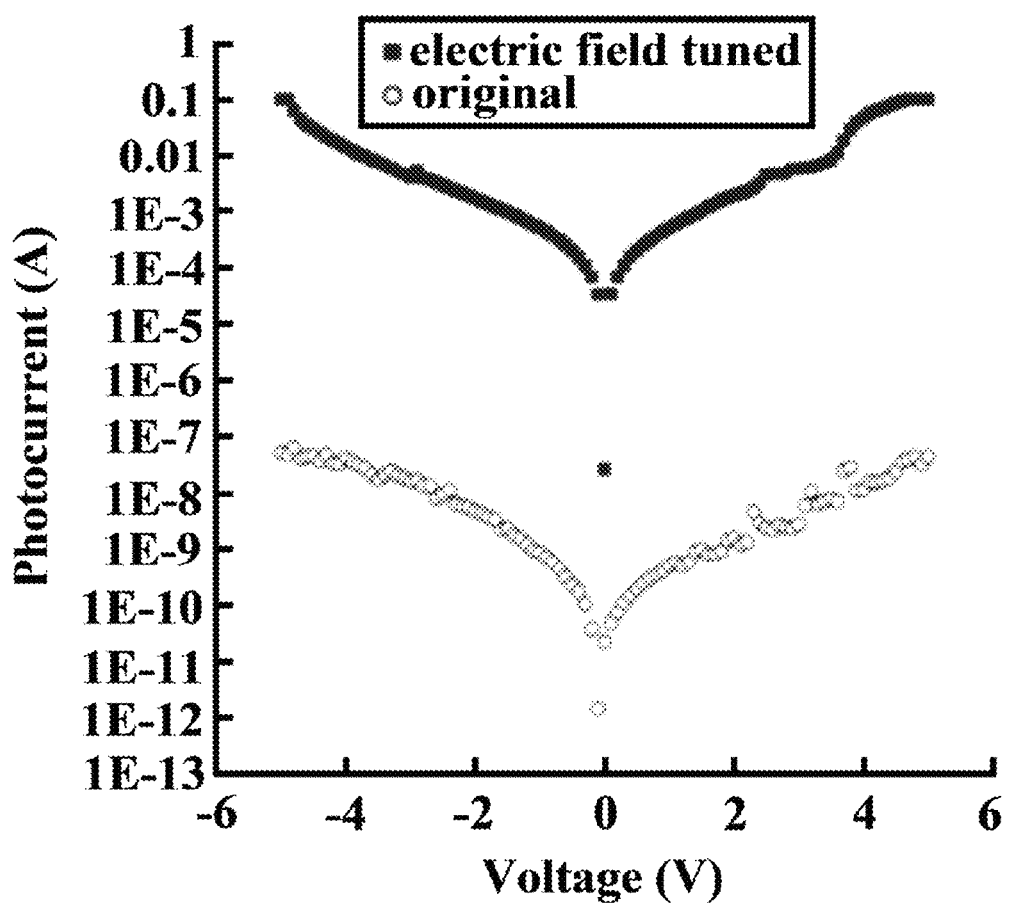

FIG. 11 shows a graph illustrating the over SIX order improvement of photocurrent under illumination from an AM 1.5 solar simulator.

Figure 12:
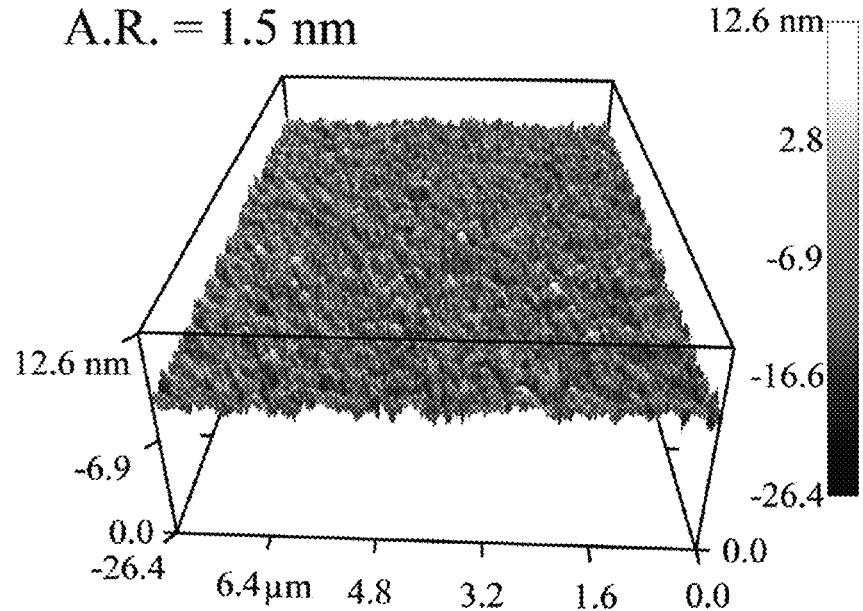
Figure 12:
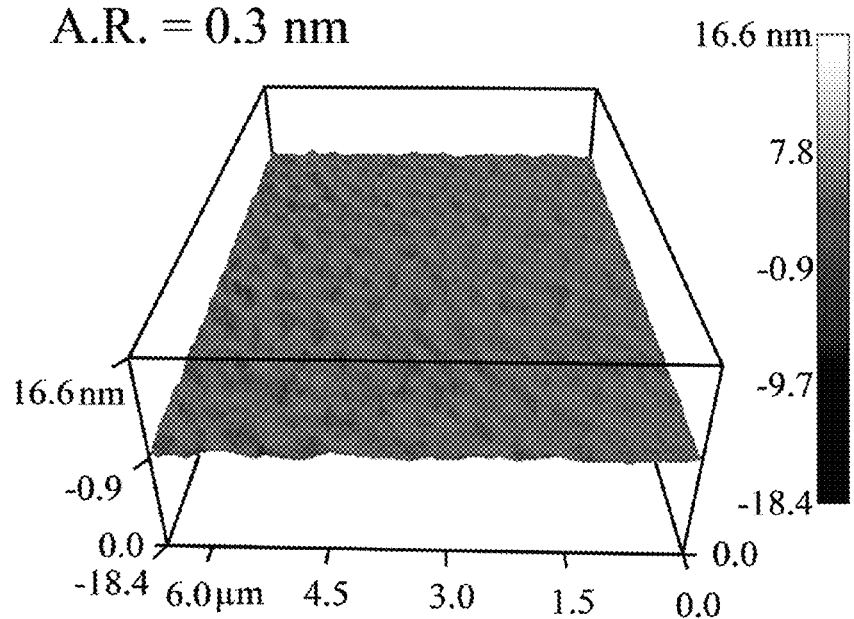

FIGS. 12(A) and (B) show AFM images of PbS film on ITO: (A) pristine with average roughness (A.R.) of the film about 1.5 nm, and (B) electric field tuned with A.R. about 0.3 nm.

Figure 13:
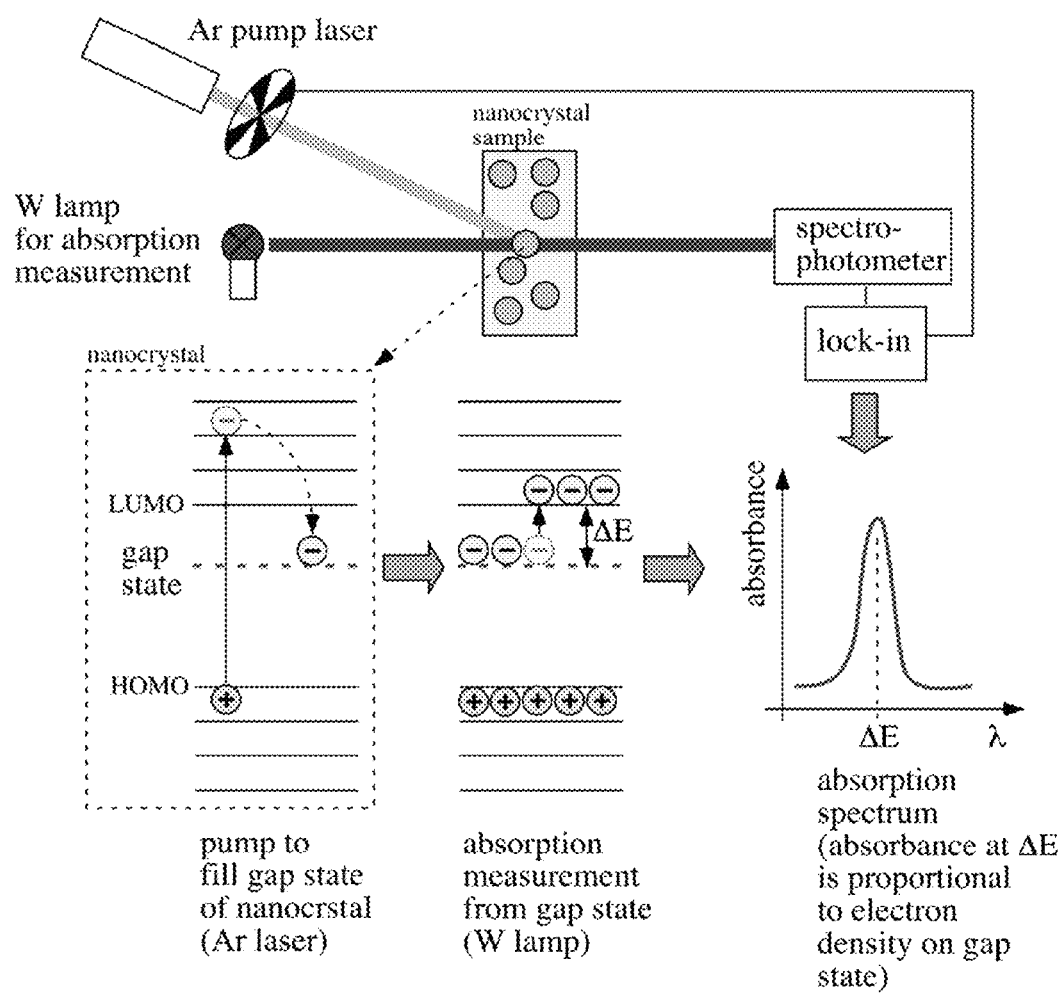

FIG. 13 is an illustration showing continuous wave photo-induced absorption spectroscopy. A regular absorption spectrum of a quantum dot is modified by pump-populating a gap state. This gives rise to a new absorption peak $\Delta E$, whose intensity is directly proportional to the electron density on the gap state.

Figure 14:
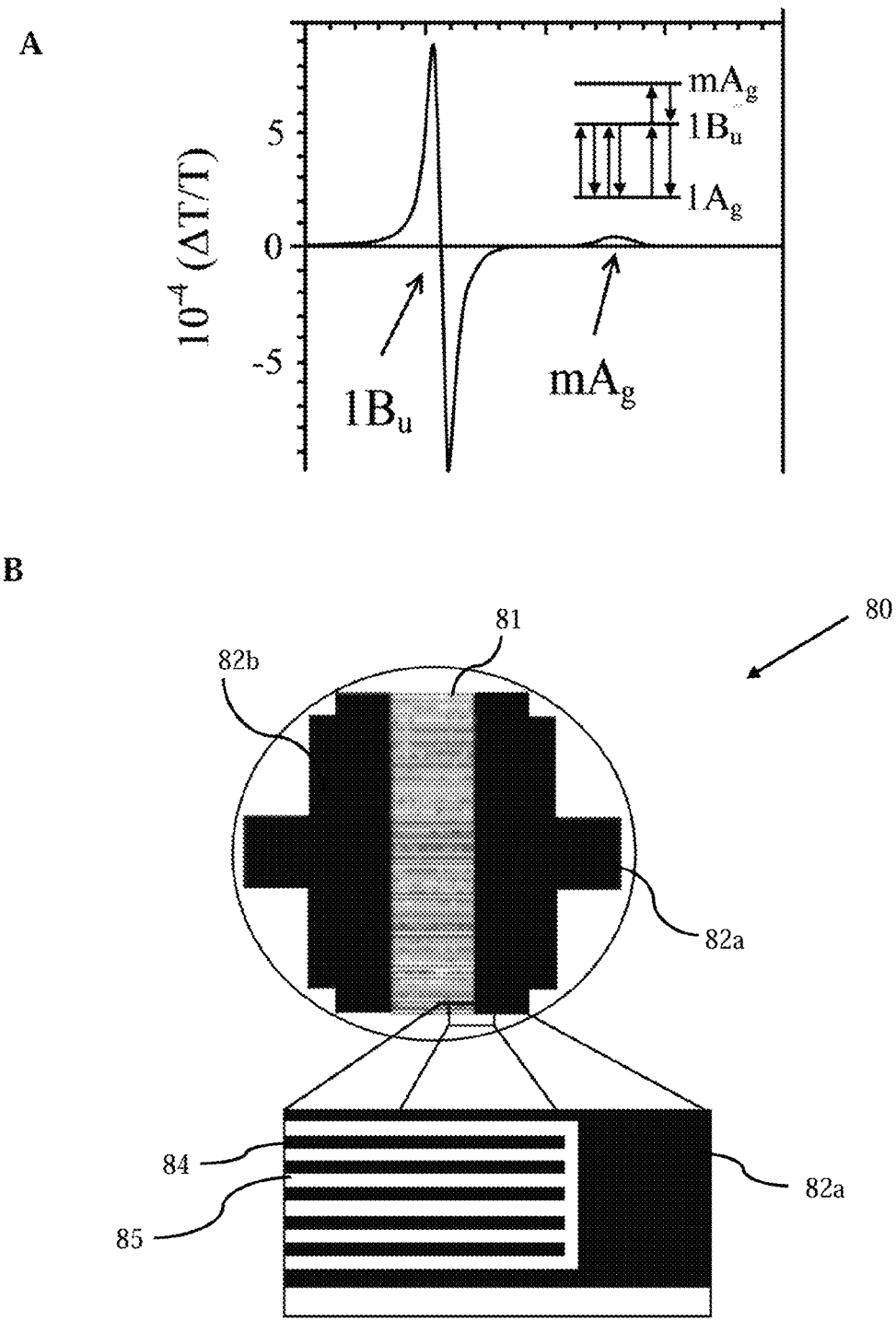

FIGS. 14(A) and (B) show electroabsorption testing procedure used on the fabricated devices. (A) a graphs showing a Stark shift in the electronic structure; (B) the interlocking finger electrode substrate to be used in electroabsorption measurements. The polymer film gets casted between the fingers (Leiss et. al., *Electroabsorption spectroscopy of luminescent and nonluminescent π-conjugated polymers*. Phys. Rev. B, 56, 15712-15724 (1997)).

Figure 15:
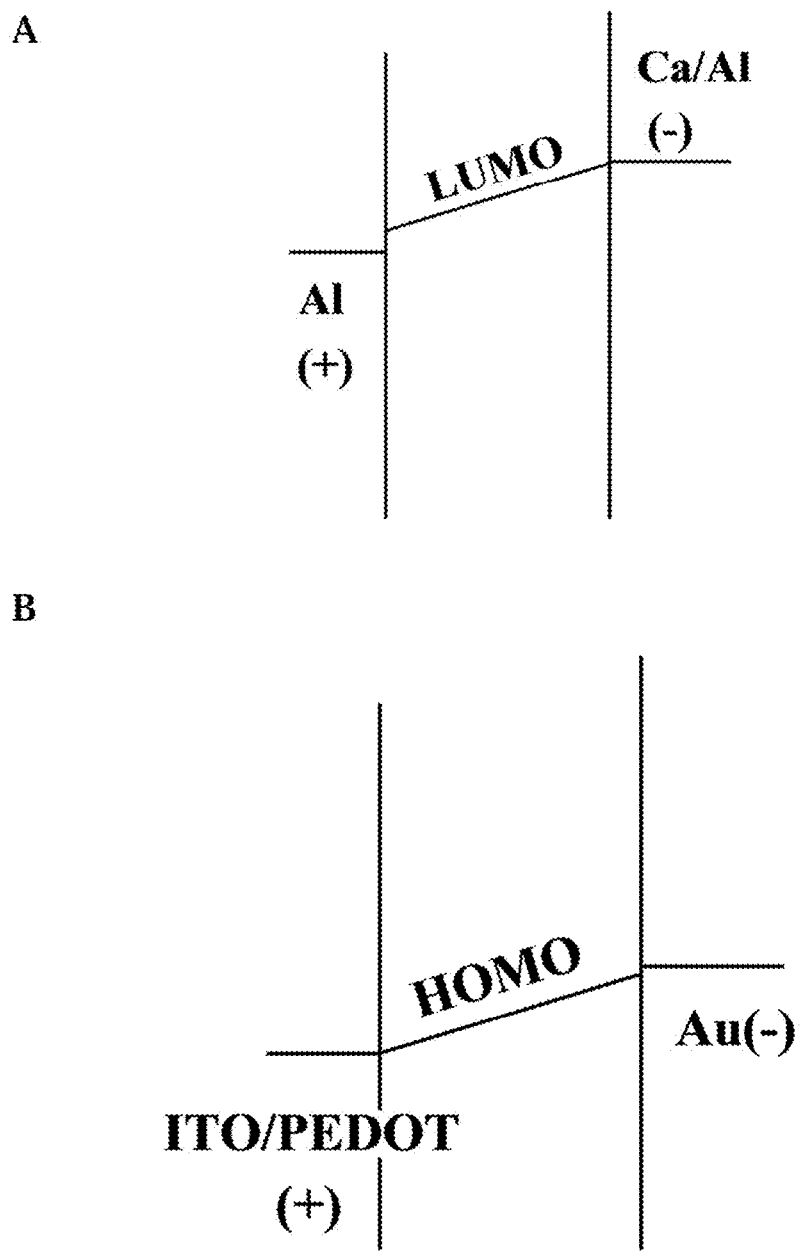
Figure 15:
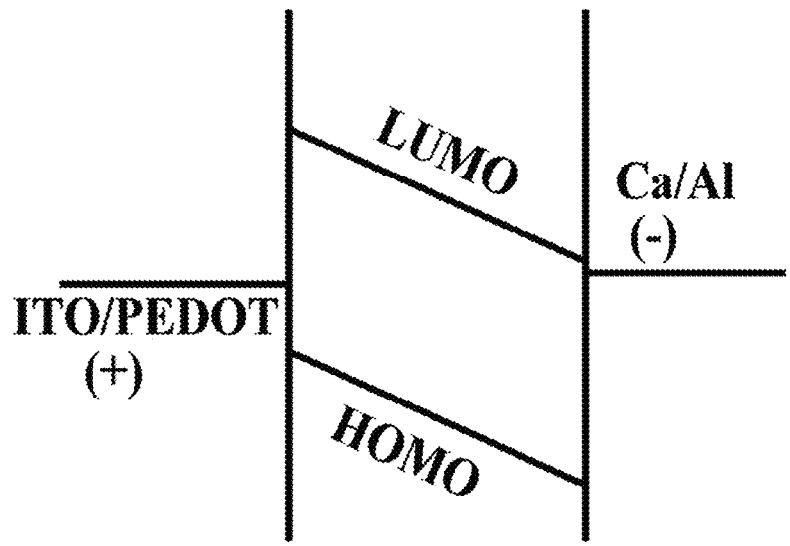
Figure 15:
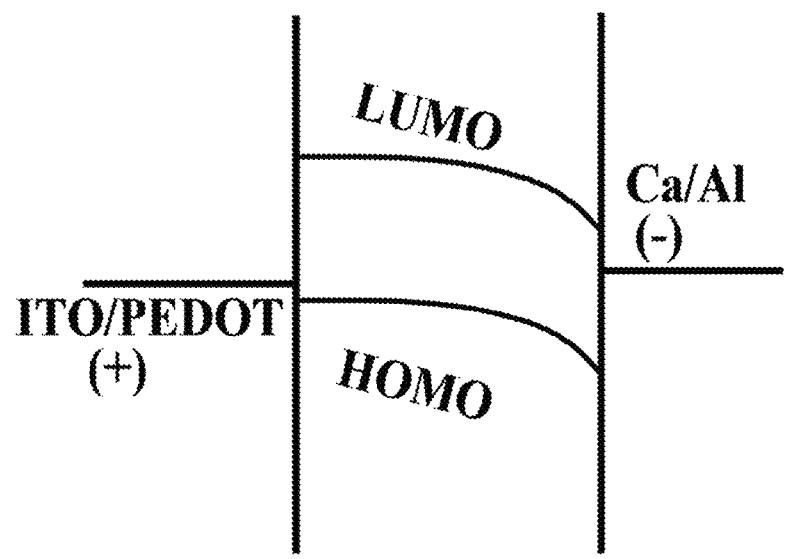

FIGS. 15(A) though (D) show types of devices used to study vertical transport. (A) electron only diode; (B) hole only diode; (c) photovoltaic diode; and (d) Schottky diode (n-type).

FIGS. 16(A) and (B) show the experimental setup for TOF and CELIVE measurements (adapted from Kokil, et al., *Techniques for characterization of charge carrier mobility in organic semiconductors*. J. Polymer Sci. B: Polymer Phys. 2012, 50(15), 1130-1144). (A) the general experimental proceusred illustrated for the test; and (B) a graph showing the Carrier Extraction by Linearly Increasing Voltage (CELIV) technique.

FIGS. 17(A) and (B) show (A) an illustration of FET with top-contact bottom gate; and (B) a graph showing current versus VDS for various values of Vg (from Mentzel, et al., *Charge transport in PbSe nanocrystal arrays*, Phys. Rev. B 77, 075316, (2008)).

Figure 18:
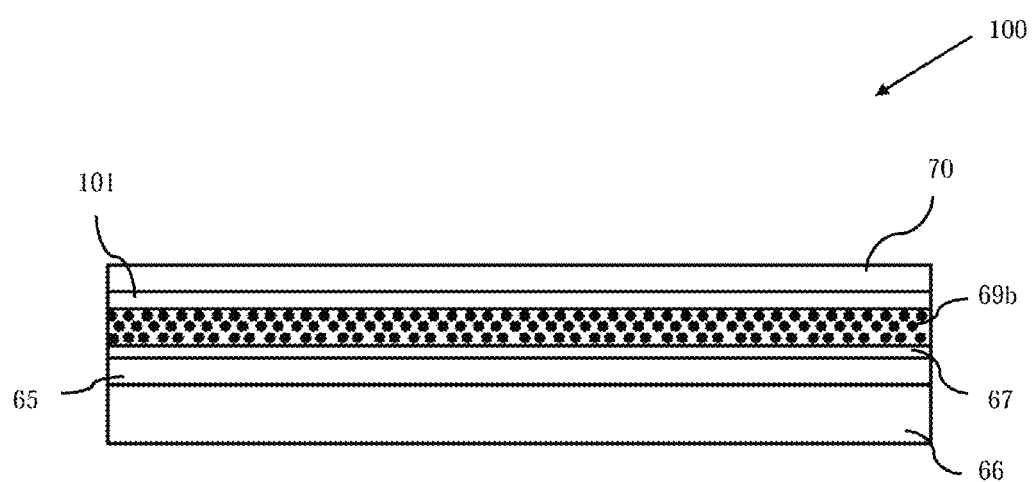

FIG. 18 is an illustration of an n-type single junction solar cell with Schottky structure. Both the top & bottom contacts can be from transparent oxides contacts.

Figure 19:
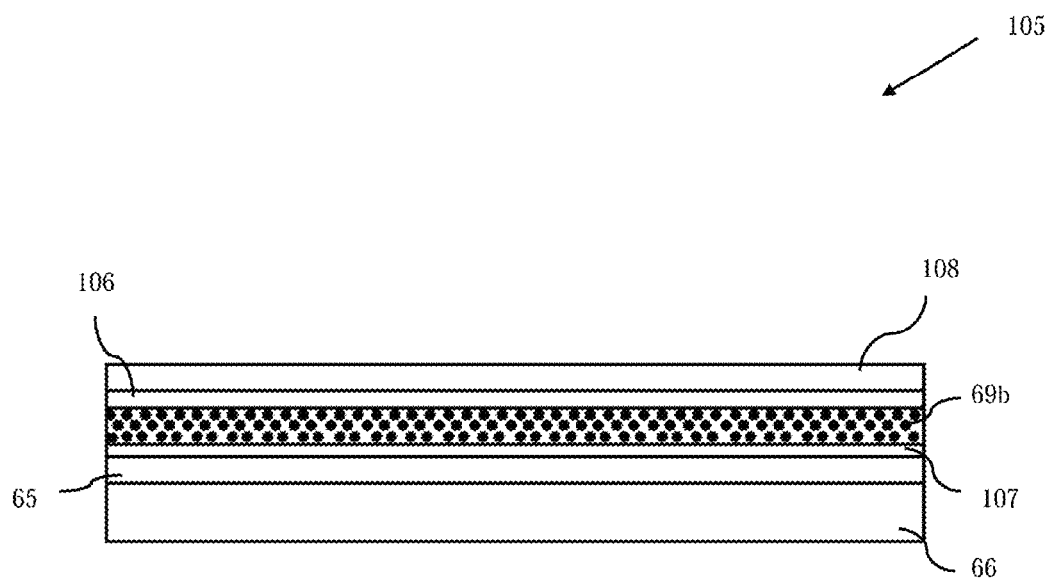

FIG. 19 is an illustration of a p-type single junction solar cell with Schottky structure. Both the top & bottom contacts can be from transparent oxides contacts.

Figure 20:
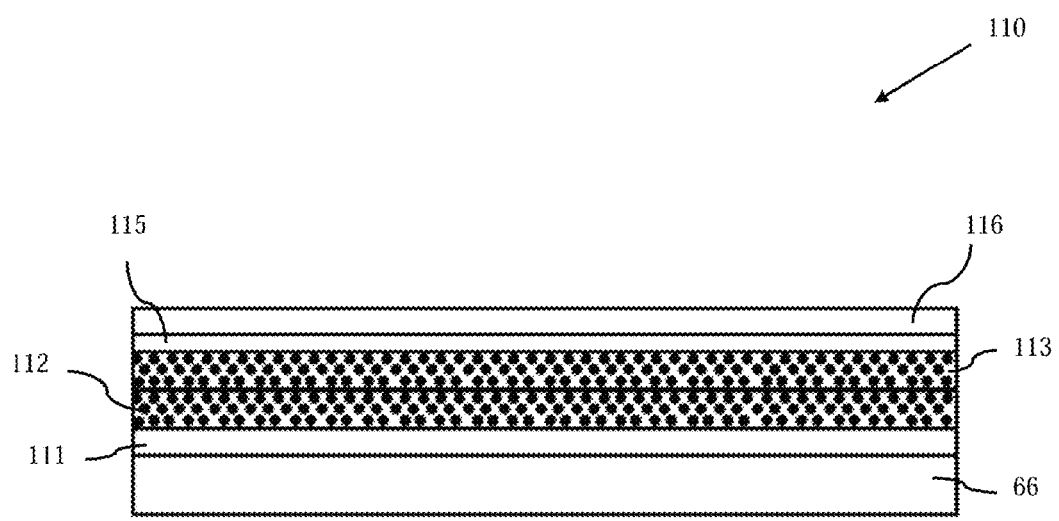

FIG. 20 is an illustration of a p-n junction QD solar cell. Both the top & bottom contacts can be from transparent oxides contacts.

Figure 21:
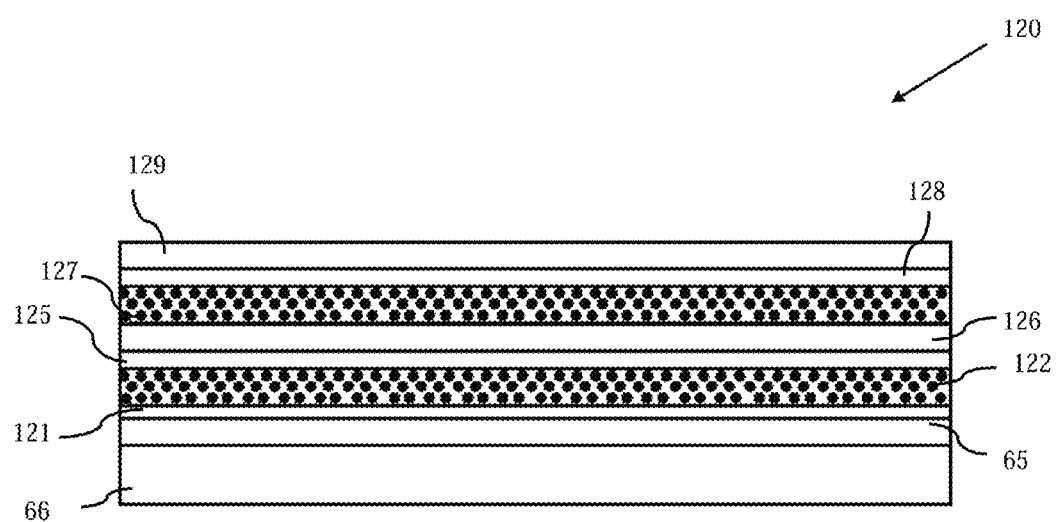

FIG. 21 is an illustration showing the device architecture for a tandem QD solar cell. The front cell contains larger bandgap (smaller QDs).

DETAILED DESCRIPTION OF THE PREFERRED EMBODIMENT

The disclosures below are illustrative only. The amounts and/or ratios of components will vary based on the sol-gel precursor and ionic liquid selected. Additionally, the use of catalyst will affect the rate of hydrolysis and may also allow variation from the ratios disclosed.

As used herein, the term "Group IV-VI" refer to compounds located at locations IVA through VIA on the periodic table. These include semiconducting materials, and specifically chalcogenides.

As used herein, the term "nanoparticle" means one or more nanoparticles with an average diameter ranging from 1 to 100 nm.

PbTe was an exemplary material however other nanocomposites are envisioned. Without limiting the invention, examples include semiconductor-semiconductor composites, metal-metal composites, and metal-non-metal composites, such as PbSe, PbSe—PbTe, $SbTe_2$—PbTe, $AgSbTe_2$—PbSe, and alloys of PbTe and PbSe such as $PbSn_xSe_{1-x}$.

Quantum dot (QD) electronics possess significant potential, with respect to power efficiency, and may open new avenues to renewable power generation. The ability to manipulate the passivation ligands of colloidal quantum dots has remained to be the top challenges of QD electronics. The realization of bare quantum dots superlattice may prove to be a paradigm shift not only for low-cost, high efficiency QD photonic devices, the new body of knowledge associated with the ordered structure of QDs also could potentially influence the fundamental understanding of low-dimensional nanomaterials.

New methods are disclosed for the production of bare quantum dots (QDs) without the common problem of coalescence after ligand washing, and to make high performance QD photonic devices based on bare QD superlattice created by means of multi-step electrostatic deposition process. The deposition process consists of atomization of QD, washing off the ligands of QDs, providing alternating positive and negative surface charges on bare QDs through either electrochemical or electrical way, and forming the bare QD superlattice via electric and/or thermal modulation.

Colloidal QDs with original long ligands (i.e. oleic acid) are atomized, and loaded into a special designed tank to be washed, followed by another atomization step before entering the doping station. The final step is the deposition of bare QDs onto substrate and growth of QD superlattice. The main idea is the creation of QDs without ligands, and control of the formation of QD superlattice by a combination of electric field and consecutive adsorption of polyanions and polycations (Decher, *Fuzzy Nanoassemblies: Toward Layered Polymeric Multicomposites*, Science 277, 197, 1232-1237). Atomization of QDs before each step uses a custom-made apparatus.

Example 1

Figure 1:
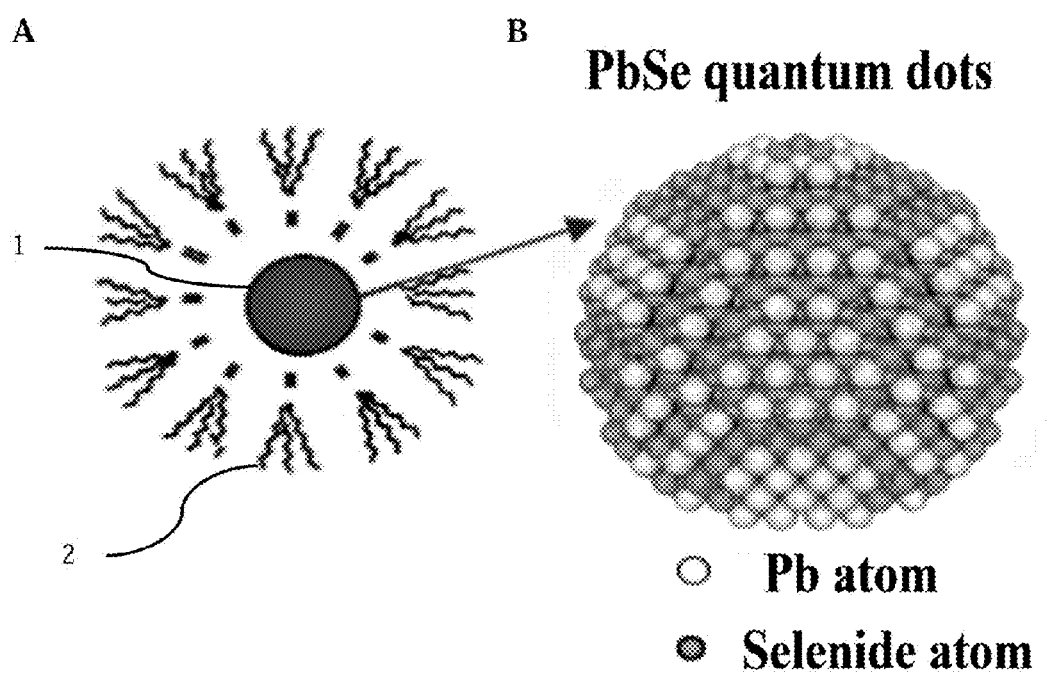
Figure 2:
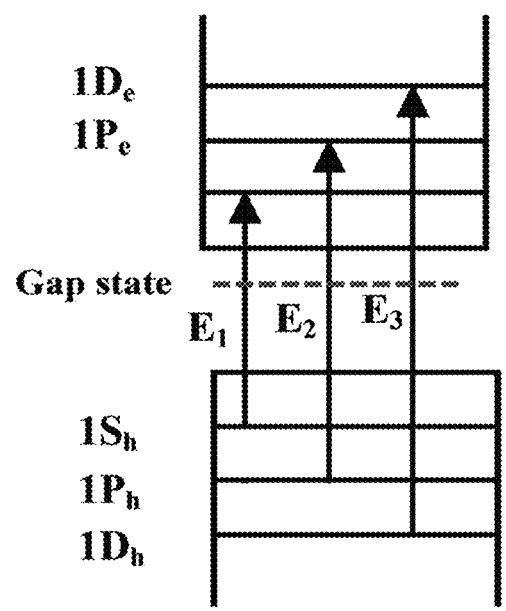
FIG. 2 shows an illustration of the quantized energy levels of a PbSe QD. The dashed line represents the in-gap state of trapped exciton in PbS QD.
Figure 3:
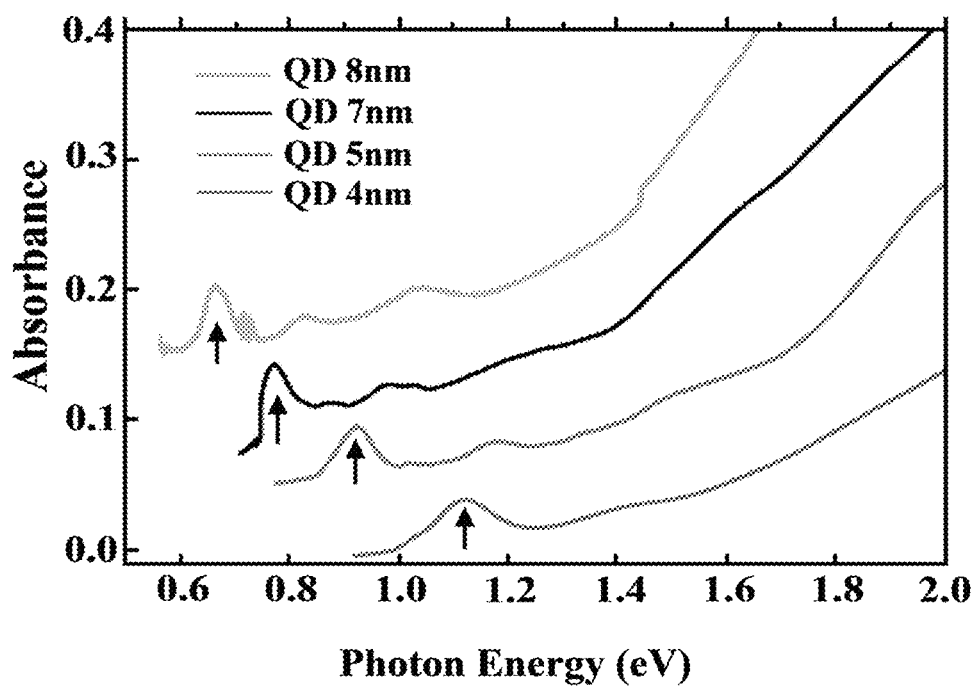
FIG. 3 shows a graph of the absorption spectra of PbSe QDs with different sizes. Arrows indicate the first excitonic peak (1Sh-1Se) in the infrared region.
Figure 4:
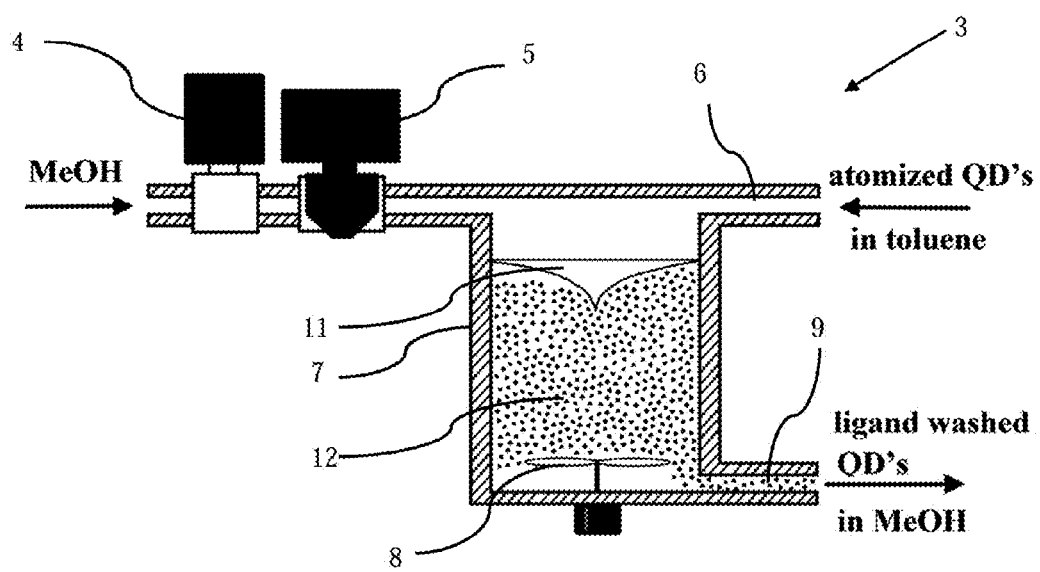
FIG. 4 shows an illustration of an agitation device used to wash QDs in methanol.
Figure 5:
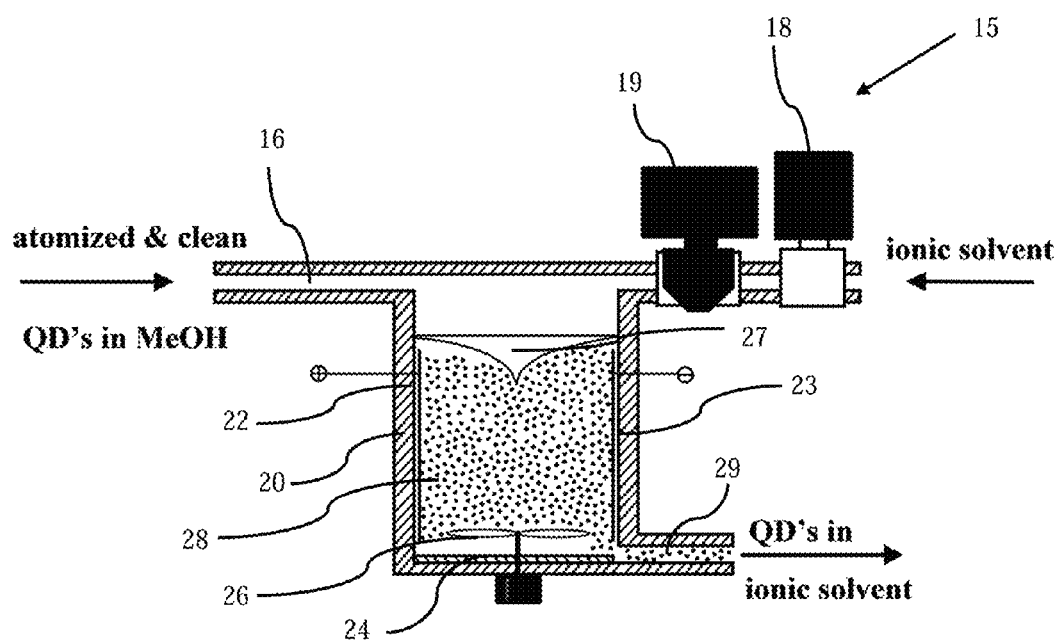
FIG. 5 shows an illustration of an ionic solvent introduction device used to provide a charge to ligand-stripped (bare) QDs.
Figure 6:
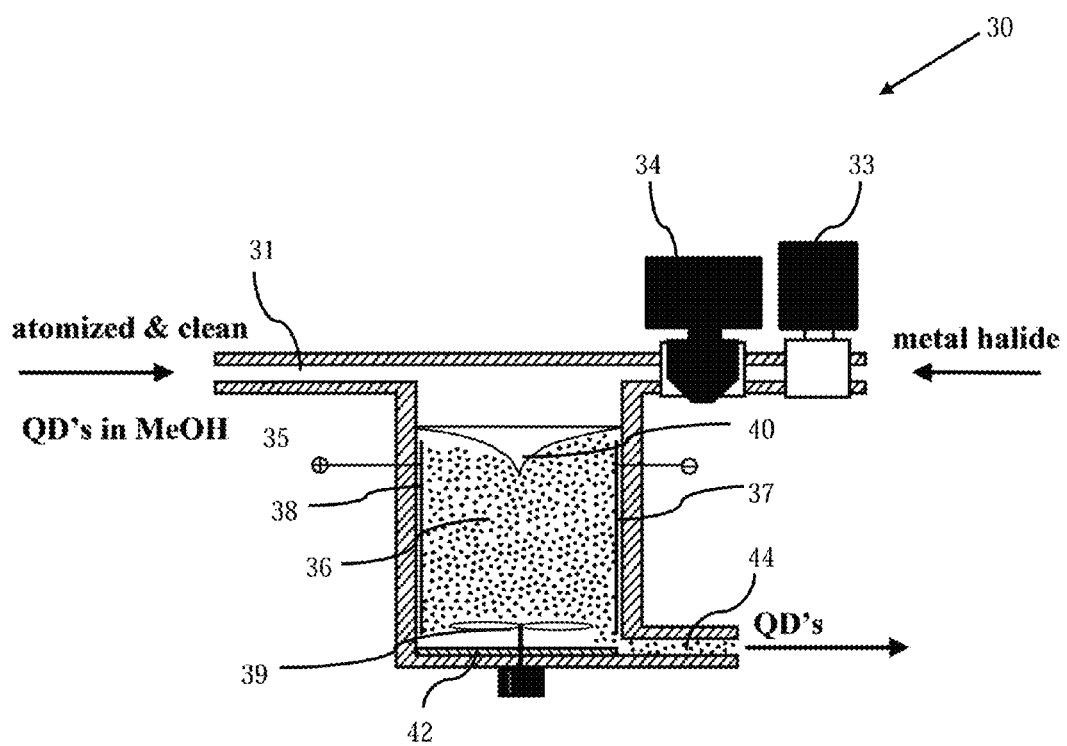
FIG. 6 shows an illustration of a replacement ion exchange device used to electrostatically provide a charge to ligand-stripped (bare) QDs.
Figure 7:
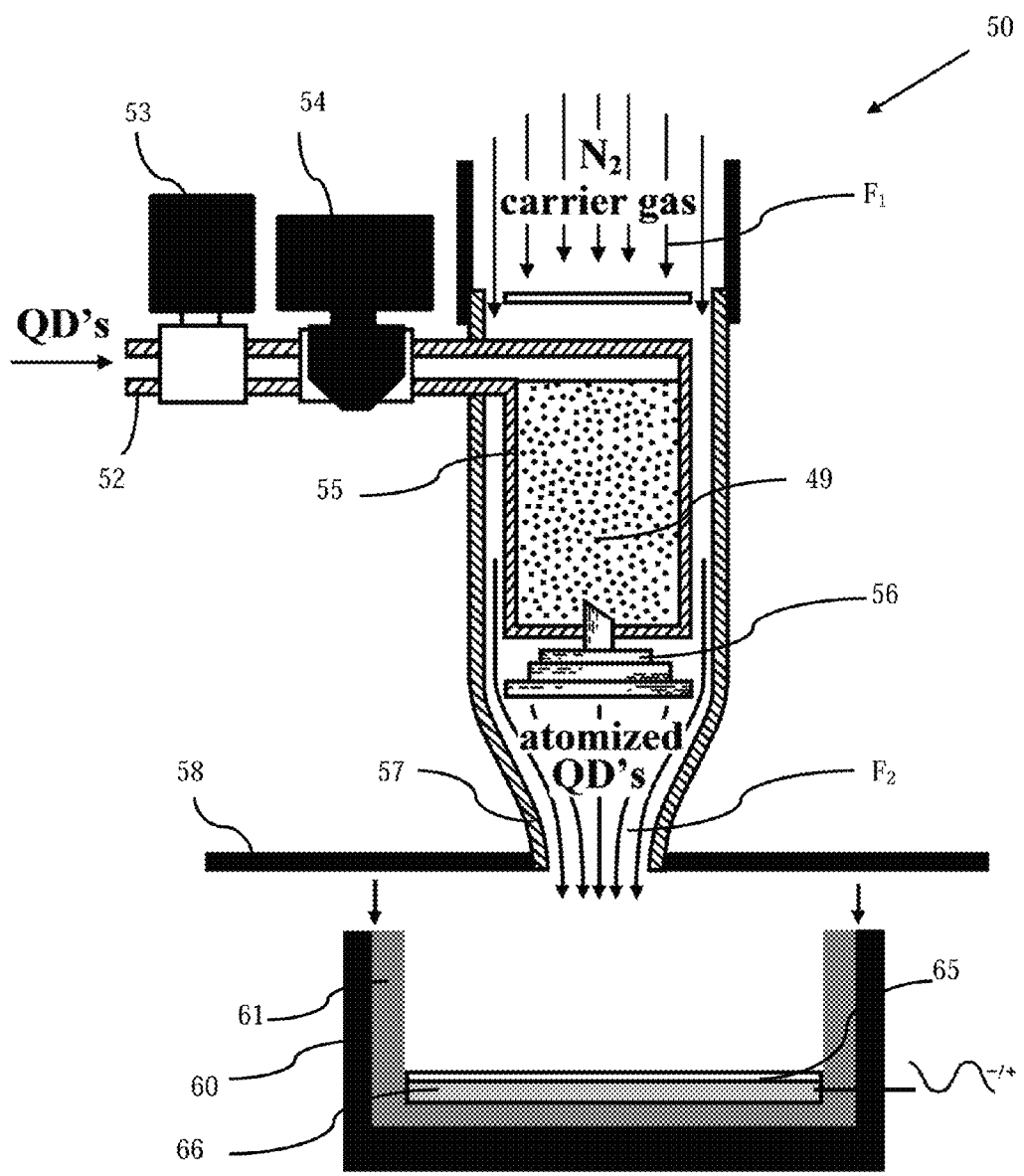
FIG. 7 shows an illustration of an atomization and deposition apparatus for atomizing QDs for deposition onto a substrate.
Figure 8:
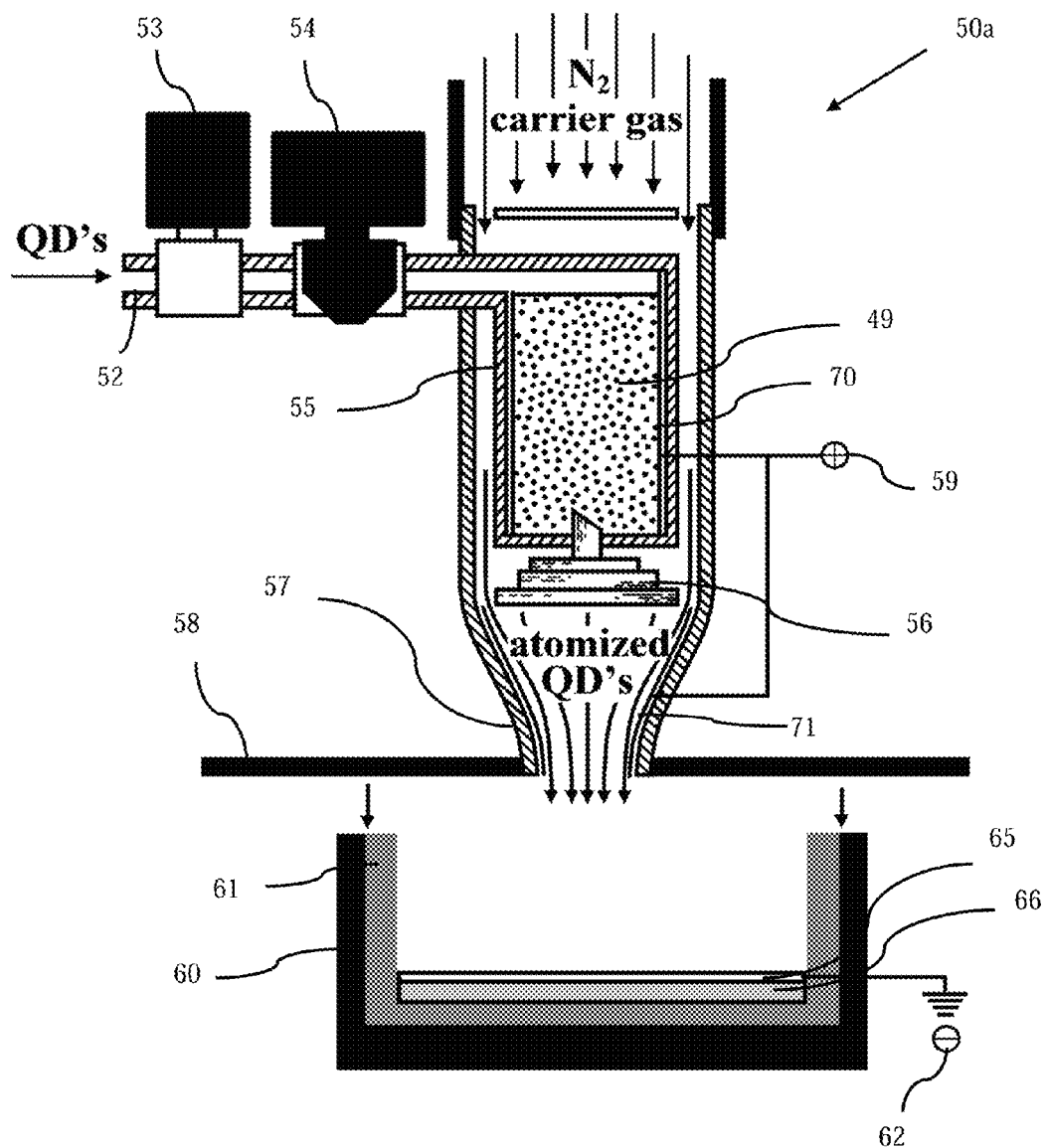
FIG. 8 shows an illustration of a charged atomization and deposition apparatus for electrostatically atomizing QDs to add opposite charges to the QDs and substrate for deposition.
Figure 9:
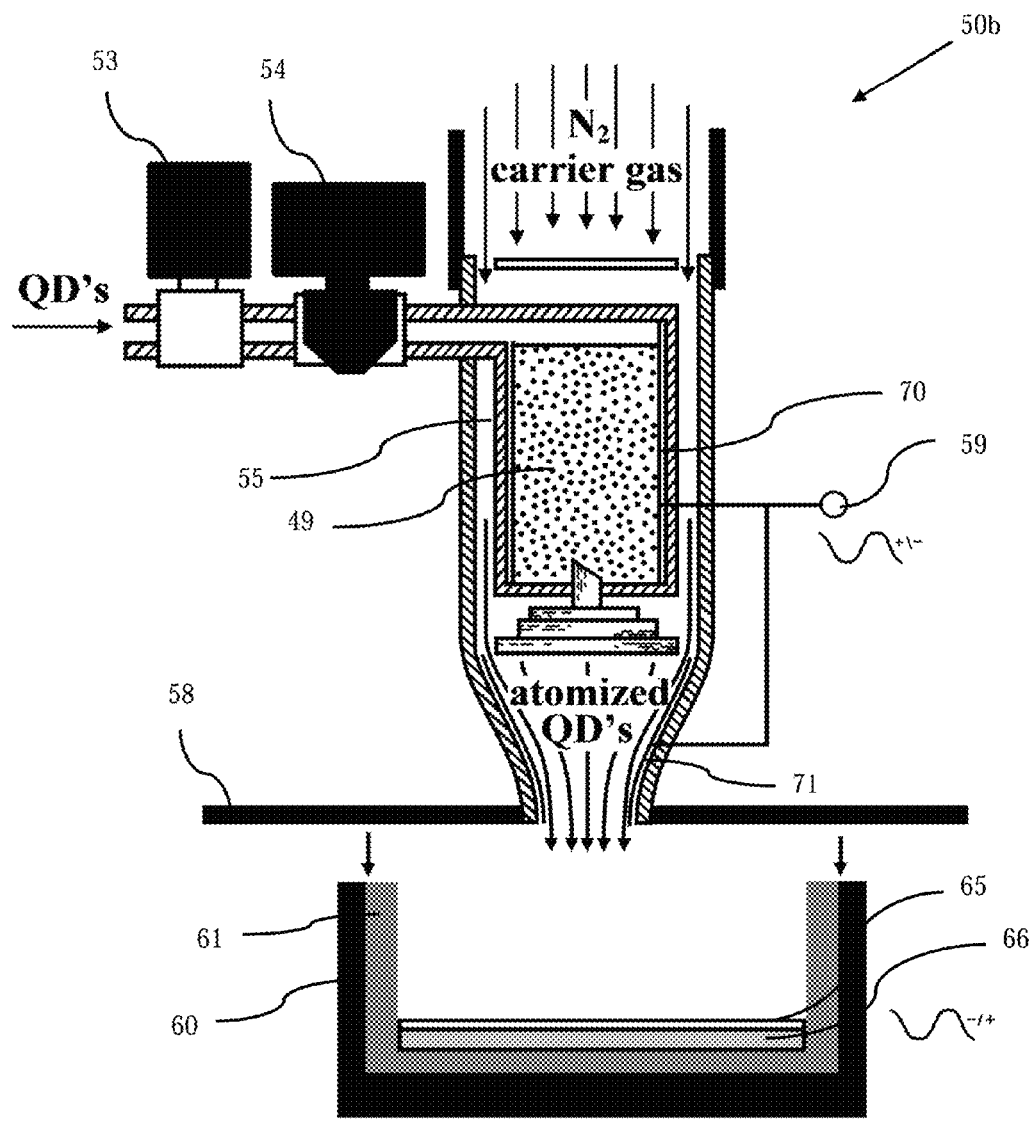
FIG. 9 shows an illustration of a variation of a charged atomization and deposition apparatus for electrostatically atomizing QDs to add opposite charges to the QDs and substrate for deposition.
Figure 10:
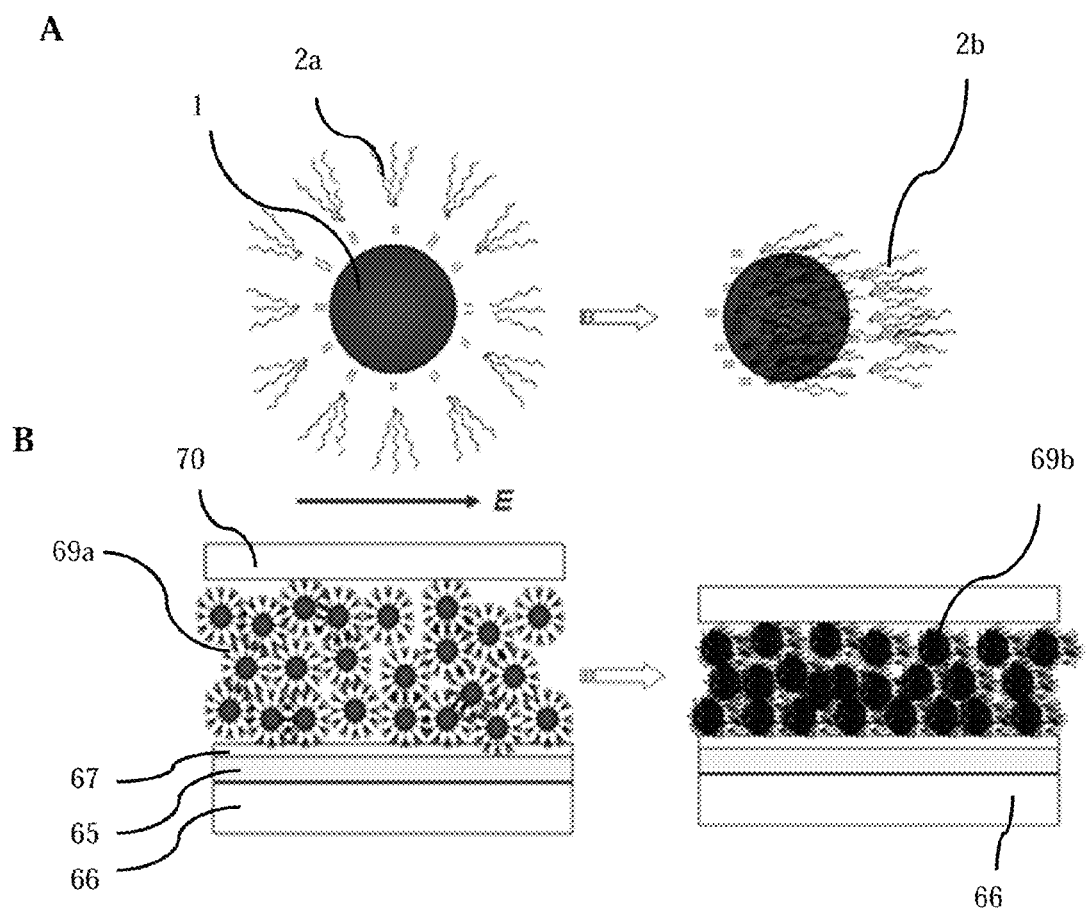

Conventional ligand washing is performed using a methanol (MeOH) washing procedure (Jiang, et al., *Nanocomposite solar cells based on polymer/PbSe quantum dot*. Proc. Of SPIE, 2005; 5938, 59381F). The drawback of this simple method is the lack of control over coalescence of QDs after the ligands were washed off. To address this issue, the present invention provides for a ligand washing system, as seen in FIG. 4. QDs were atomized using either a transducer or ultrasonic vibration device. Separating the QDs by atomization before entering the methanol washing apparatus prevents initial sticking of the QDs. In the illustrated version, the QD's were atomized in toluene and enter agitation device 3 through quantum dot input channel 6. However, other organic solvents, such as hexane and chloroform may be used in place of toluene. Methanol is likewise added to agitation device 3. To control the mixture of methanol to QD, the methanol flow is controlled by micro valve 4, which is electrically connected to flow meter 5, thereby allowing adjustment of the methanol flow into quantum dot agitation chamber 7, and provide for precise control of the concentration of the bare QDs before substrate deposition. The methanol and quantum dots combine in quantum dot agitation chamber 7, and are mixed by agitator 8 and agitation vortex 11 to form quantum dot solution 12, as seen in FIG. 4. The shearing forced provided by agitator 8 and agitation vortex 11 in wash the ligand from the exterior surface of the quantum dots. Upon completion of the wash, the quantum dots are transferred from the quantum dot agitation chamber 7 via quantum dot output channel 9. The mechanical agitation provided by quantum dot agitation chamber 7 prevents the coalescence of QD's. At the same time, the agitation also provides funneling force to separate QDs from the oleic acid ligands.

To increase the miscibility of QDs with methanol, n-butyl alcohol is optionally added to the QDs, as n-butyl alcohol has shown to greatly improve the ligand washing effect (Jiang, et al., *Nanocomposite solar cells based on polymer/PbSe quantum dot*. Proc. Of SPIE, 2005; 5938, 59381F). In addition, the whole apparatus can be placed into ultrasonic bath to further enhance the dispersion effect.

The bare QDs from agitation device 3 are to re-atomized prior to enter the doping tank, using either an ionic solvent or ion exchange to provide a countercharge, i.e. opposing charge to the QD.

Example 2

A charge is provided to the bare QDs using an electrolyte (ionic solvent) with opposite charge. For positive electrolytes, non-limiting choices are poly(allylamine hydrochloride) ($NH_3Cl$), 2-mercaptoethylamine (MEA) (Decher, *Fuzzy Nanoassemblies: Toward Layered Polymeric Multicomposites*, Science, 1997; 277(5330), 1232-1237; Klar, et al., *Super efficient exciton funneling in LbL semiconductor structures*, Adv. Materials, 2005; 17(6), 769-773), for negative ionic solvent, non-limiting choices are sodium salt of poly(styrene sulfonate) ($NaSO_3$), thioglycolic acid (TGA).

The washed quantum dots, in methanol, are transferred from agitation device 3 to ionic solvent introduction device 15, as seen in FIG. 5. Atomized and cleaned QD's, in a methanol solvent, enter to ionic solvent introduction device 15 through quantum dot ionic input channel 16. An ionic solvent is concurrently introduced into ionic solvent introduction device 15, with the flow of the ionic solvent controlled by micro valve 18, which is electrically connected to flow meter 19, thereby allowing adjustment of the ionic solvent flow into ionic agitation chamber 20. The quantum dots are mixed with the ionic solvent by ionic agitator 26 and ionic agitation vortex 27 to form quantum dot ionic solution 28. Charging plates 22 and 23 are connected to an electrical source, allowing the plates to provide a charge to quantum dot ionic solution 28. Further, quantum dot ionic solution 28 may be heated by heating plate 24. After the QD's have been sufficiently suspended in the ionic solvent, the solution of QDs in the ionic solvent are removed from ionic solvent introduction device 15 by quantum dot ionic output channel 29.

To prevent the ionic solvent molecules from sticking on to the bare, and charged, QD molecules, any added ionic solvent is optionally washed off in a bath of deionized (DI) water. A layer by layer washing approach can be performed if the ionic solvent creates a new surface passivation of the QDs.

Example 3

A charge is provided to the bare QDs electrostatic variation where the final atomization stage adds a positive or negative charge to the atomized QD's.

The washed quantum dots, in methanol, are transferred from agitation device 3 to replacement ion exchange device 30, as seen in FIG. 6. Atomized and cleaned QD's, in a methanol solvent, enter replacement ion exchange device 30 through quantum dot exchange input channel 31. An exchange ion, such as a metal halide like $CdCl_2$, (Ip, et al., Hybrid passivated colloidal quantum dot solids, Nat Nanotechnol, 2012; 7, 577-582) in solvent is concurrently introduced into replacement ion exchange device 30, through micro valve 33. Flow of the exchange ion is controlled by micro valve 33, which is electrically connected to flow meter 34, thereby allowing adjustment of the exchange ion flow into exchange agitation chamber 35. The quantum dots are mixed with the exchange ion in solvent by ion exchange agitator 39 and ionic agitation vortex 40 to form quantum dot ion exchange solution 36. Exchange charging plates 37 and 38 are connected to an electrical source, allowing the plates to provide a charge to quantum dot ion exchange solution 36. Further, quantum dot ion exchange solution 36 may be heated by exchange heating plate 42. After the QD's have been sufficiently suspended in the solvent with exchange ion, the solution of QDs in solvent are removed from replacement ion exchange device 30 by quantum dot ion exchange output channel 44.

Example 4

Quantum dot solution 49, from Example 2 or 3, is transferred to a deposition spray device. The QD assembly is done by depositing consecutively positive and negative charged layers, much like the process used in layer-by-layer (LbL) deposition, however, at a much more efficient and faster rate (Klar, et al., *Super efficient exciton funneling in LbL semiconductor structures*, Adv. Materials, 2005; 17(6), 769-773), due to the critical atomization process.

Example 5

The QD assembly is done by using electrostatic atomized spray to add opposite charges to the QDs and substrate, thereby causing the QDs to be attracted to the substrate.

Quantum dot solution 49, from Example 2 or 3, is transferred to atomization and deposition apparatus 50 through atomizer input 51, as seen in FIG. 7. Flow of the QDs is controlled by micro valve 53, which is electrically connected to flow meter 54, thereby allowing adjustment of the QDs. Quantum dot solution 49 flows into quantum dot atomizer chamber 55, and is stored there until the QDs are collected by atomizer 56. A carrier gas flows through atomization and deposition apparatus 50, exterior to quantum dot atomizer chamber 55, as indicated by flow $F_1$. As carrier gas flows around atomizer 56, atomized QDs are aerosolized in the carrier flow. The aerosolized QDs flow through a port in atomizer/substrate enclosure 58, indicated by flow $F_2$. Spray head 57 is polarized with a charge, thereby imparting a charge onto the QDs.

Glass substrate 66, with indium tin oxide (ITO) layer 65 is disposed in substrate mount 60, having temperature element 61, for QD deposition. The ITO-substrate is charged, such that the polarity of the ITO-substrate is reversed to the polarity on the spray head. Aerosolized QDs are attracted to the ITO-substrate target, and deposit onto the exposed face of the target. This approach can be used to create net negative (n-type), or net positive (p-type) QD superlattice.

Alternatively, atomization and deposition apparatus 50 is charged atomization and deposition apparatus 50*a*, as seen in FIG. 8, which replaces ionic solvent introduction device 15 and replacement ion exchange device 30 in Examples 2 and 3, with a single device. Charged atomization and deposition apparatus 50*a* includes quantum dot solution charging plate 70, which is electrically connected to charging source 59. Atomizer charging plate 71 is disposed in spray head 57 in addition, or in the alternative, to charging plate 70. This permits the atomized QDs to be polarized with a charge at the spray head just prior to deposition. Glass substrate 66 is charged with a reversed polarity to the spray head using grounding power source 62. In another variation of the charged atomizer is alternated charged atomization and deposition apparatus 50*b*, as seen in FIG. 9. In alternated charged atomization and deposition apparatus 50*b*, charging source 59 is an alternating current charging source, with the substrate having a reverse charge, i.e. an out-of-phase alternating current.

After deposition, the QD film is neutralized during annealing by grounding the substrate. This is extremely important for photodetectors, LEDs, and improper neutralization may pose charging problem in solar cell. By annealing the QD deposited substrate while being grounded, excess charge is removed from the QDs, while concurrently improving nanomorphology of the QD layer, as noted in U.S. patent application Ser. No. 12/862,260. Alternatively, a low voltage alternating low current is applied to the substrate for a short time, pulling any excess charge, whether be p-type or n-type, from the device. The electric field applied to the substrate during annealing also controls of superlattice formation. The success of this control largely depends on the dipole moment strength, and coupling between substrate and the QDs. In situations where an electric field is insufficient to control the neutralization and superlattice formation, a thermal field is applied to assist the process. FIGS. 7 through 9 disclose design elements on the substrate mount that provide heating/cooling dual elements to assist arrangement of QDs. Temperature element 61 is designed to be able to cool the substrate to create condensation of QDs. The atomizer may include variations permitting other parameters to be tailored to modulate the film solidification, such as solvent selection, drying time, carrier gas pressure, viscosity and temperature of the solution. Such variations to the system would be apparent to one of skill in the art, such as higher pressure lines for increased carrier gas pressure, larger ports or higher pressures for more viscous materials, and material selection for different desired solvents.

Example 6

QDs are optionally doped prior to deposition. QD doping is controlled, for either p-dope or n-dope, doping is performed using an electrolyte, i.e. ionic solvent with opposite charge, or electrostatic variation using ion exchange, as described in Examples 2 and 3. Alternatively, the steps described in Examples 2 and 3 may be eliminated and the QDs doped during the atomization electrostatic spray process, in which the bare QDs in solution can be charged by placing a charged metal plate (can be positively or negatively charged) in the holding tank before atomization, as seen in FIGS. 8 and 9. Alternatively, electrostatic atomized spray is used to add opposite charges to the QDs and substrate so QDs will be attracted to the substrate. This approach can be used to create net negative (n-type), or net positive (p-type) QD superlattice, as seen in FIG. 8. One more approach is to apply an electric field onto the photovoltaic device during the final annealing process, when the device is allowed to cool to room temperature before the electric field is removed, as seen in FIG. 9.

Example 7

A QD PV device was prepared by applying PEDOT:PSS layer 67 over a patterned indium tin oxide (ITO) layer 65, which coated glass substrate 66, low alkaline earth boroaluminosilicate glass substrate (Delta Technology, Inc.), such as using the methods described in Lewis, et al. (U.S. patent application Ser. No. 12/862,260). A solution of oleic acid-QDs was deposited onto the PEDOT:PSS layer, forming QD layer 69*a*, using a drop casting or spin coating procedure, and electrically treated. Aluminum layer 70 was deposited onto aligned QD layer 69*b*. During the drying process of the QD solution, a linearly increasing DC electric field was applied, such as $5\times10^4$ V/m. The Electric field started at about 5V and linearly increasing in about 5V increments up to about 50V. The duration between each increment increase was optionally between about one and about two minutes. In some embodiments, the voltage was held for approximately 2 minutes, followed by a manual voltage increase over about 30-40 seconds to achieve the next 5V increment. The observed DC current was about 35 mA. After about twenty minutes, the quantum dots film completely dried up and a smooth film was observed (much smoother than the original drop-cast quantum dots from the same solution. This caused ligand 2*a*, oleic acid in the present example, of QD 1 to align in a single direction, as aligned ligand 2*b*, as seen in FIG. 10(A), thereby forming aligned QD layer 69*b*, as seen in FIG. 10(B). The method results in a denser, more uniform QD layer, as seen in FIG. 10(B). Testing of the QD PV device showed the device possesses over four orders improvement of photoconductivity at zero bias and more than six orders improvement at 5V reverse bias, as seen in FIG. 11, due probably to the influence of electric field on dopant density and density of states. This evidences that the dipole in the as-synthesizes QDs were affected by electric field. Furthermore, the electric field has noticeable effect on QD nanomorphology as well, with more than 5× improve in film smoothness, as seen in FIGS. 12(A) and (B).

The method may be used to prepare various QD layer structures, Nonlimiting examples include single-size multilayer An, as seen in FIGS. 9(A)-(C), and alternating multilayer in the combination of $A_nB_m$, as seen in FIG. 10, where A &B stands for different sizes QDs, and index n and m give the repeating pattern. This structure can be expanded to more than 2 sizes of QDs.

Where the QDs require a repassivation, such as where bare QDs are not successfully created due to instability in solution, or serious oxidation effect, the bare QDs are re-passivated using the atomization process. The bare QDs are re-passivated using the ion replacement ion exchange device 30 to provide an exchange ion, such as a metal halide. Alternatively, QDs are atomized using the atomizer shown in FIGS. 7 through 9, which will make the conventional ligand manipulations such as washing and exchange much more efficient and easier to handle. Combining with electrostatic modulation, this alternative also could work to create QD superlattice, and improve the efficiency of current QD photonic devices, which may yield a much more efficient way of manipulating QD ligands without the need of harmful chemicals, and also with the possibility of creating n-type and p-type QDs.

Example 8

The correlation of inter-dot coupling, lattice structure, QD film morphology, exciton generation and recombination, and energy transfer process are studied in the bare QD films, as well as information about electronic states, dynamics of exciton, recombination kinetics and midgap states of QD superlattice. Control samples are prepared using as-synthesized QD films and isolated QDs in solution (Yu, et al., Preparation and characterization of monodisperse PbSe semiconductor nanocrystals in a noncoordinating solvent. Chem. Mater, 2004. 16: p. 3318). This permits characterization the optical response by linear absorption spectroscopy as well as nonlinear and modulated absorption methods.

Absorption spectroscopy provides first insight of electronic and vibrational structure of the excited state and also about the morphology. The photo-luminescence (PL) spectrum elucidates a rich structure of radiative recombination mechanism in these materials. A PL technique employing an Integrating Sphere (Kang & Wise, *Electronic structure and optical properties of PbS and PbSe quantum dots*, J. Opt. Soc. Am. B. 1997, 14, 1632-1646) allows the accurate calculation of the photo-luminescence quantum efficiency (PLQE), which is related to the rates of radiative and non-radiative recombination. Both steady state PL and transient PL spectra are to be measured, and the radiative decay dynamics can be extracted.

Testing is performed to characterize long-lived midgap states (i.e., energy levels, lifetime, activation energy and recombination mechanism) is essential for understanding QD devices potentials (Nagpal & Klimov, Nat. Comm. 2001, 2, 486). The key technique for this is the continuous wave photoinduced absorption (cw-PA) spectroscopy. FIG. 13 shows the techniques schematically. In principle the technique is a standard absorption measurement combined with a chopped pump laser. The pump (cw Ar+ laser) excites the QDs with photons of energy larger than the optical gap of the quantum dots (for example, Eg=1.07 eV for a 4 nm PbS quantum dot). The excited electrons thermalize into long lived midgap states. This process changes the absorption spectrum since now the transition $\Delta E$ becomes possible. A new peak arises in the spectrum at a wavelength commensurable with $\Delta E$ (for example $\Delta E$=0.33 eV for a 4 nm PbS quantum dot), as is schematically indicated. The important feature of this measurement is that the magnitude of this absorption peak PA is linearly proportional to the density of the electrons occupying this gap state by $$PA = -\frac{\Delta T}{T} \approx n\sigma d \qquad \text{Eq 1}$$

where n is the photoexcitation density, $\sigma$ its optical cross section, and d the film thickness, and PA is the photoexcitation intensity (magnitude of $\Delta E$ peak in FIG. 13). In addition to measure density of photoexcitations, one other important function of cw-PA is to measure the lifetime ($\tau$) of photoexcitation by varying modulation frequency f, the activation energy (ET) of sub-gap state by varying sample temperature T and the recombination kinetics by varying pump light intensity.

Other nonlinear modulation spectroscopy, such as electroabsorption (EA) which uses an applied electric field to generate a Stark shift in the electronic structure (Bublitz & Boxer, *Stark spectroscopy: applications in chemistry, biology, and materials science*. Annu Rev. Phys. Chem. 1997, 48, 213-242), is performed as well, or in place of the above-referenced testing. Furthermore, the mixing of oscillator strengths in the presence of the E-field allows one to previously optically forbidden excited states (i.e. E(mAg)) (Leiss, et. al., *Electroabsorption spectroscopy of luminescent and nonluminescent π-conjugated polymers*. Phys. Rev. B. 1997, 56, 15712-15724), as well as that of the optically allowed state E(1Bu), as seen in FIG. 14(A). The energy difference of E(mAg) and E(1Bu) gives the binding energy $E_b$ [$E_b$=E(mA$_g$)–E(1B$_u$)] of the singlet exciton, an important parameter for solar cells. To test the electroabsorption, interlocking finger electrode substrate 80 is formed with electrode array 81 sandwiched between first contact surface 82a and second contact surface 82b, which are formed on sapphire substrate 83. Electrode array 81 has gold-coated electrode fingers 84 with finger width of 20 μm, and gaps 85 of 20 μm. A polymer film, such as polythiophene, is casted between the fingers.

As oxidation can cause additional trap states (Stouwdam, et. al., *Photostability of Colloidal PbSe and PbSe/PbS Core/Shell Nanocrystals in Solution and in the Solid State*, J. Phys. Chem. C. 2007, 111, 1086-1092). generally producing PbO, $PbSO_3$ and $PbSO_4$ (Lobo, et. al., Photoelectron Spectroscopic Investigations of Chemical Bonding in Organically Stabilized PbS Nanocrystals, J. Phys. Chem. B. 2005, 109, 17422-17428; Minden, *Effects of Oxygen on PbS Films*, J. Chem. Phys. 23, 1948-1955 (1955)), which serve as trapping centers and energetic barriers for carrier transport and lowering its mobility. Oxidation is an import issue because it is directly related to any QD device stability and lifetime. Controlled experiments, including intentional exposure of QDs to different environments (i.e., $O_2$, $O_2+H_2O$ and $O_2+H_2O+$ light), with exposure time and temperature to be the secondary modulators, are performed on the test devices. Surface trapping, which is of particular relevance for bare QD since the surface is completely exposed, are determined using XPS to measure the surface chemistry and electronic levels of QDs, as well as defining how these trap states affect exciton generation, recombination and lifetime.

Example 9

Figure 17:
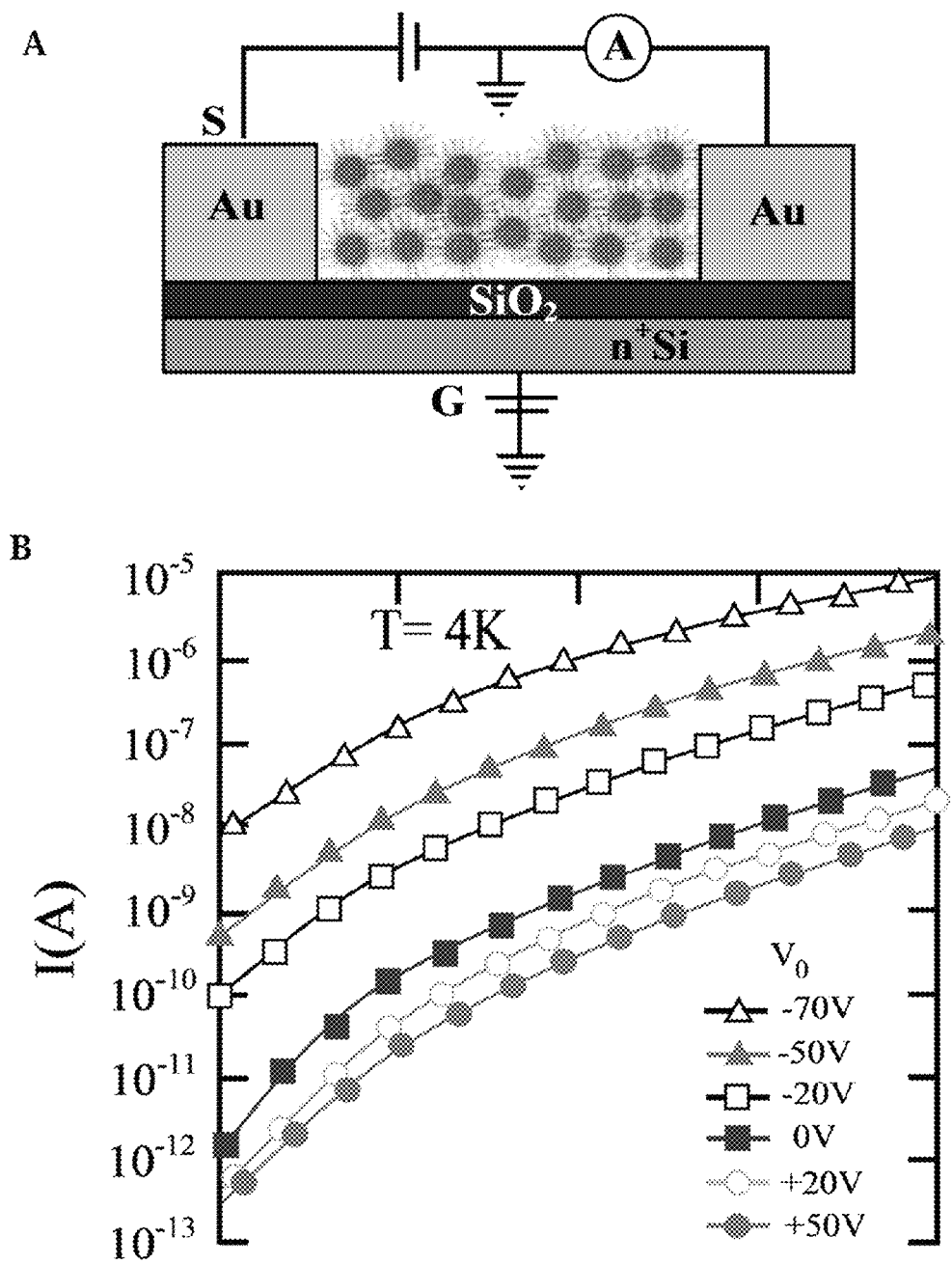

The increased degree of electronic coupling in bare QD superlattice, and its influence the transport behaviors, comparing with ligand-QD films and isolated QDs, is tested. Four devices are prepared for vertical transport using the methods described above, including blocking contact structure where only one carrier (either electron or hole) is allowed, as seen in FIGS. 15(A) and (B); the second type is the photovoltaic diode where extraction of both electrons and holes are considered, as seen in FIG. 15(C); Schottky diode where the formation of depletion zone helps extraction of charge, as seen in FIG. 15(D). For lateral transport characterization, field effect transistor geometry is utilized, as seen in FIG. 17.

Mobility, $\mu$, is measured by any one or more of the following techniques. One of the simplest ways to extract the mobility from low-mobility materials is through the analysis of space charge limited conduction in a single carrier diode. Due to the low mobility, the injection of carriers will quickly lead a build-up of space charge in the bulk of the organic layer and the current density, J, will follow Child's Law (Lampert & Mark, *Current Injection in Solids*, Academic Press: New York, (1970)):

$$J = \frac{9}{8}\varepsilon\varepsilon_0\mu\frac{V^2}{d^3} \quad \text{Eq 2}$$

This measurement allows for thicknesses relevant to QD superlattice film to be studied. Furthermore, by conducting the J-V measurement through the electrical terminals of the closed cycle cryostat, the temperature dependence of the mobility can be easily obtained.

Figure 16:
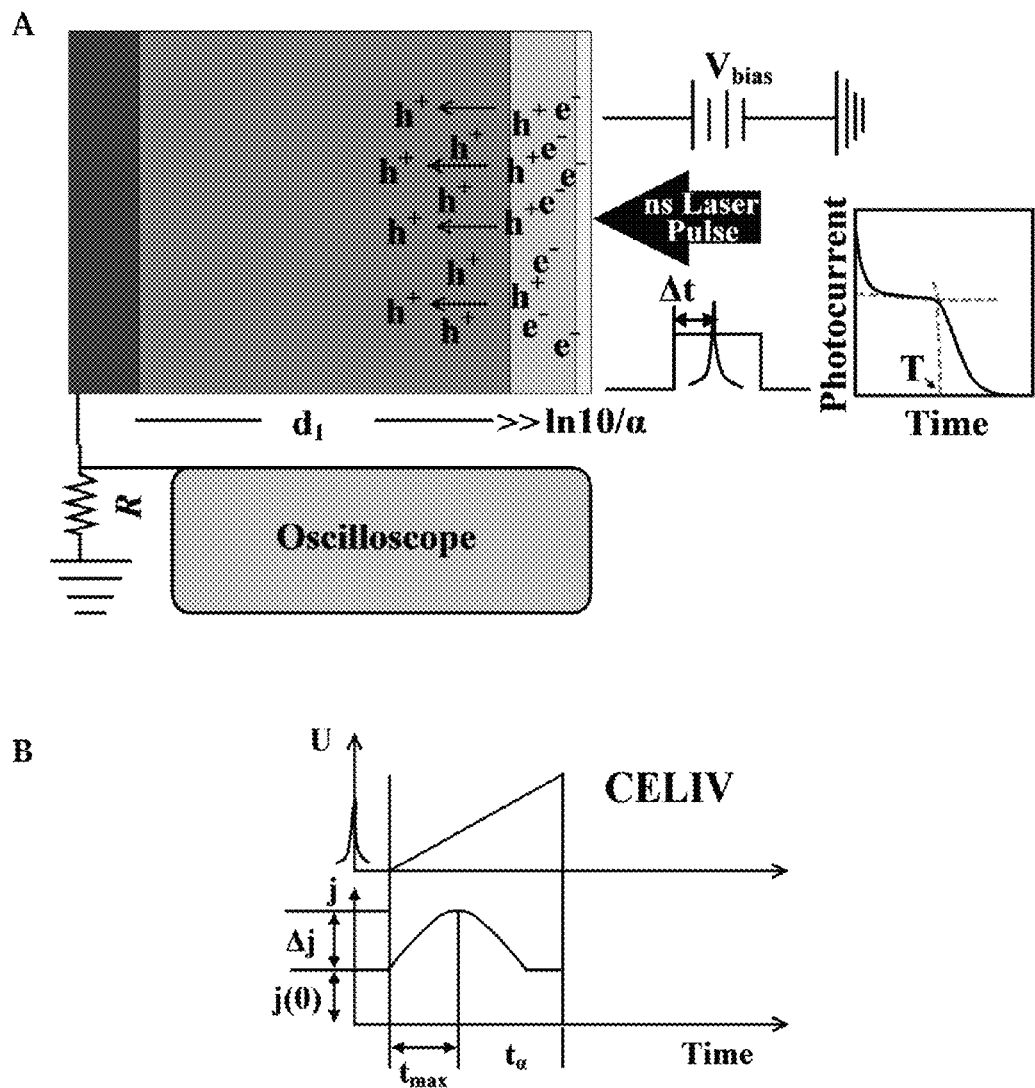

The charge carrier mobility in low conductivity and low mobility samples is measured using the Time-of-Flight (TOF) Photocurrent transient (Kokil, et al., *Techniques for characterization of charge carrier mobility in organic semiconductors*. J. Polymer Sci. B: Polymer Phys. 2012, 50(15), 1130-1144). The material is sandwiched between two electrodes at least one of which is transparent. A laser pulse is used to generate charge carriers at one surface of the film with thickness $d_1$, which is optionally around 10 μm, and an applied negative DC voltage provides a drift field for the photogenerated carriers, as seen in FIG. 16. From the measurement of the carrier transit time $t_{tr}$, the mobility ($\mu$) of correspondent carriers (electron or holes) could be calculated as $$\mu = \frac{d}{(t_{tr}E)} = \frac{d^2}{(t_{tr}V)} \quad \text{Eq 3}$$

The limits of TOF measurement (i.e., thick, low mobility and conductivity samples) are optionally complimented by Carrier Extraction by Linearly Increasing Voltage (CELIV) technique (Juška, et. al.; Charge transport at low electric fields in π-conjugated polymers. Phys. Rev. B. 2002, 65, 233208), which shares the same setup as TOF, as seen in FIG. 16. Instead of constant bias (square) voltage in TOF, CELIV applies a linearly increasing (triangle) voltage (U=At, where A is the voltage rise speed) across a sandwich type sample with two blocking contacts, and a transient current is recorded in the oscilloscope. A short laser pulse is used to generate the charge carriers. (Österbacka, et. al., *Mobility and density relaxation of photogenerated charge carrier in organic materials*, Current Appl. Phys. 2004, 4, 534). The time to reach the extraction current maximum ($t_{max}$) is used to estimate the drift mobility of the (photogenerated) charge carriers. $\mu$ can be calculated by:

$$\mu = K\frac{d^2}{dAt_{max}^2[1+0.36\Delta j/j(0)]} \quad \text{Eq 4}$$

$$j(0) = \varepsilon\varepsilon\frac{A}{d} \quad \text{Eq 5}$$

where K=2/3 for volume generated, and K=2 for surface generated charge carriers, respectively (BES10). j(0) is the extracted current at t=0.

On the other hand, lateral charge mobility are measured using a Field Effect Transistor (FET) in a top-contact bottom gate structure operating in accumulation mode, as seen in FIG. 17. The mobility, or more specifically the FET mobility $\mu_{FET}$, can be extracted from either the linear regime drain-source current:

$$I_{DS} = \frac{W}{L}\mu_{FET}C[(V_{GS}-V_T)-V_{DS}/2]V_{DS} \quad \text{Eq 6}$$

or the saturation regime drain-source current (drain-source voltage $V_{DS} \gg V_G - V_T$ where $V_G$ and $V_T$ are the gate and threshold voltages respectively) (Kokil, et al., *Techniques for characterization of charge carrier mobility in organic semiconductors*. J. Polymer Sci. B: Polymer Phys. 2012, 50(15), 1130-1144):

$$I_{DS} = \frac{W}{2L}\mu_{FET}C[(V_{GS}-V_T)^2 \quad \text{Eq 7}$$

Here, W and L are the width and length of the channel while C is the capacitance of the gate dielectric.

Capacitance-Voltage measurement is conducted to extract the amount of dark charges that are generated in QD films due to intentional doping when creating n-type and p-type QDs, or unintentional doping such as oxidation. This curve is well described by the Mott-Schottky relation (Rhoderick & Williams; *Metal-Semi-conductor Contacts*, Clarendon Press: Oxford, (1988)):

$$C^{-2} = \frac{2(V_{BI}-V)}{A^2\varepsilon\varepsilon_0 N_A} \quad \text{Eq 8}$$

Here, $N_A$ is the number of ionized acceptor dopant molecules and is equivalent to the number of dark extrinsic charges. $V_{B1}$ is the built-in field due to the accumulation of these charges in the bulk. This is of particular interest when studying the oxidation effect, and the doping of bare QDs since it can measure the dopant density.

Example 10

Bare QD superlattice photonic devices are fabricated and characterized using QD superlattice solar cells as an exemplary device. Two superlattice solar cells are prepared, a Single junction device and Multi junction device.

The single junction device was tested using two device structures, a modified depleted heterojunction structure and a p-n junction device. The modified depleted heterojunction structure has produced the highest efficiency QD solar cell (Ip, et al., Hybrid passivated colloidal quantum dot solids, Nat Nanotechnol, 2012; 7, 577-582). The merit is a combination of Schottky diode good at sweeping out the minority carriers at the depletion zone and improved collection of majority carriers at the other contact via the addition of either electron transport layer such as ZnO, TiOx. In this variation of the modified depleted heterojunction structure, n-type Schottky diode solar cell 100 includes glass substrate 66 with ITO layer 65 disposed on the upper face of the substrate, as seen in FIG. 18. PEDOT:PSS layer 67 is overlaid on the ITO layer, followed by aligned QD layer 69b. Electron transport layer 101, seen as LiF in the present example, is applied over the QD layer, followed by aluminum layer 70. In another variation, p-type Schottky diode solar cell 105 includes hole transport layer 106, such as PEDOT:PSS and MoO$_3$, applied over the QD layer, as seen in FIG. 19. The ITO-coated glass substrate is coated in ZnO/TiO$_2$ layer 107, followed by the QD layer, the MoO$_3$ layer, and finally gold (Au) layer 108. However, previous work has not utilized QDs without ligands. The difference between n-type QD layer and p-type QD layer is controlled by initial doping of QD layer, which can be easily controlled at the QD charging stage.

The p-n junction device is prepared by depositing a layer of n-type bare QDs on top of a p-type bare QD layer, and the creation of p-n junction serves to separate electron and holes, as seen in FIG. 20. In this device, p-n junction solar cell 110 includes glass substrate 66, having aluminum layer 111 disposed on the upper face. QD(–) layer 112, i.e. a layer of p-type bare QD, is deposited on aluminum layer 111, followed by QD(–) layer 113, which is a layer of n-type bare QDs. MoO$_3$ layer 115 is disposed on the QD layers, followed by gold layer 116. The top and bottom electrodes can be replaced by appropriate transparent conductive oxides (TCO), for instance, n-type TCO can be ZnO or TiOx, and p-type TCO can be MoOx (Dou, et. al., *Tandem polymer solar cells featuring a spectrally matched low-bandgap polymer*. Nat. Phonton. 6(3), 180-185), or ZnSe/ZnTe (Mahawela, et al., *Transparent high-performance CdSe thin-film solar cells*, Thin Solid Films. 2005, 480-481, 466-470).

Multi junction bare QD solar cells are fabricated to increase V$_{oc}$ of the device. An inverted tandem structure was prepared, as seen in FIG. 21 (Dou, et. al., *Tandem polymer solar cells featuring a spectrally matched low-bandgap polymer*. Nat. Phonton. 6(3), 180-185). Multi junction bare QD solar cell 120 comprises glass substrate 66 coated on its upper face with ITO layer 65. ZnO layer 121 is disposed on ITO layer 65. Small QD layer 122 is deposited on ZnO layer 121, and is optionally made of ZnO nanoparticles, i.e. ZnO quantum dots. Lower hole-transport material layer 125, such as a layer of PEDOT:PSS, is disposed on small QD layer 122, followed by ZnO layer 126. Large QD layer 127 is deposited on ZnO layer 126, and is optionally made of PbSe QDs. Upper hole transport layer 128, such as MoO$_3$, is applied over large QD layer 127, and silver electrode 129 deposited over upper hole transport layer 128. ZnO nanoparticles are used as the electron-transport material because their work function matches well with the acceptors and the high electron mobility (Chou, et. al., *Metal-oxide interconnection layer for polymer tandem solar cells with an inverted architecture*. Adv. Mater. 2011, 23, 1282-1286). PEDOT:PSS was used as the hole-transport material for PbSe QDs. These two layers combined serve as the recombination layer between front (smaller QDs) and back cells (larger QDs).

The fabricated devices are characterized to determine the standard I-V measurement which gives operational parameters such as Voc, Isc, FF and η. Modifications to a standard diode equation:

$$J = J_{sat}(e^{q(V-JR_S)/k_BT} - 1) + \frac{V - JR_S}{R_{SH}} \qquad \text{Eq 9}$$

yield important device parameter such as series resistance Rs, shunt resistance RSH and FF (Schilinskya, et. al., *Simulation of light intensity dependent current characteristics of polymer solar cells*, J. Appl. Phys. 2005, 95, 2816-19).

Additionally, the fabricated devices are studied to determine photocurrent dependence on illumination intensity, to distinguish geminate recombination, i.e., recombination of a photogenerated charge pair that never escapes their mutual Coulomb attraction, which is often treated by Braun's modification of Onsager theory, from non-geminate recombinations which is dealt with by Langevin process. Since exciton dissociation, to a first order approximation, does not depend on excited state density while bimolecular recombination does. The excited state density can be adjusted in a solar cell by changing the illumination intensity. Therefore, a fair amount can be inferred about the recombination mechanisms based on the light intensity dependence of solar cell photocurrent (Greenham, & Alivisatos, *Charge separation and transport in conjugated-polymer/semiconductor-nanocrystal composites studied by photoluminescence quenching and photoconductivity*. Phys. Rev. B. 1996, 54, 17628).

Example 11

Devices were prepared using the structure of a single junction solar cell, which will be either the normal, as seen in FIG. 18, or the inverted, as seen in FIG. 19, device geometry. Comparing with photovoltaic devices, a photoconductive detector works at the reverse bias region. Photoconductors works on extraction of one type of charge carrier (either hole or electron) meanwhile immobilizing (or trapping) another charge carrier. There are three figures of merits (Potter & Eisenman, *Infrared Photodetectors: A Review of Operational Detectors*, Applied Optics. 1962, 1, 567-574): spectral responsivity R=I$_{ph}$/P$_{in}$ (A/W), normalized detectivity (sensitivity) D*=A$^{1/2}$/NEP (cm. Hz$^{1/2}$/W) (A is detection area), and noise equivalent power NEP (the minimum detectable signal). A good photodetector has large R &D* and small NEP. R &D* are related to the internal optical gain (G), defined as G=τ/t$_r$ (Rao & Bhattacharya, *High-gain In$_{0.53}$Ga$_{0.47}$As:Fe photoconductive detectors*, Electronics Lett. 1984, 20, 812-813), where τ is the trapped carrier lifetime and tr the mobile carrier transit time. τ determines the detection speed, whereas t$_r$ depends on mobility of the extracted carrier. High optical gain is favorable for large R and D*. However, a trade-off between gain (thus D*) and detector speed is obvious, and a balance between carrier lifetime and transit time is essential for an ultrasensitive fast response photodetector.

The use of bare QD superlattice promises significant increase on mobility, or reduction of t$_r$. It is essential, though, that the trapped carrier lifetime τ would be maintained or shortened to improve detection speed. For photodetectors, it is important to minimize dark current Id to enhance detectivity, since they are related by (Sarasqueta, et al., *Organic and inorganic Blocking Layers for Solution-Processed Colloidal PbSe Nanocrystal Infrared Photodetectors*. Adv. Funct. Mater. 2011, 21, 167-171):

$$D^* = \frac{R}{\sqrt{2eI_d/A}} \qquad \text{Eq 10}$$

Several approaches have proven to be effective with reducing Id, which includes passivation of QDs with functional ligands (Sarasqueta, et al., *Effect of Solvent Treatment on Solution-Processed Colloidal PbSe Nanocrystal Infrared Photodetectors*. Chem. Mater. 2010, 22(11), 3496; Koleilat, et al., *Efficient, Stable Infrared Photovoltaics Based on Solution-Cast Colloidal Quantum Dots*. ACS Nano 2008, 2(5), 833-40), and the use of carrier blocking layers in a device to impede charge injection under reverse bias (Gong, et al., *High-Detectivity Polymer Photodetectors with Spectral Response from 300 nm to 1450 nm*. Science 2009, 325(5948), 1665; Keivanidis, et al., *All-solution based device engineering of multilayer polymeric photodiodes: Minimizing dark current*. Appl. Phys. Lett. 2009, 94 (17), 173303). The choice of electron blocking layer (EBL, or HTL) can be poly-TPD (poly(N,N'-bis(4-butylphenyl)-N,N'-bis(phenyl)benzidine) and TFB, and hole blocking layer (HBL) can be C60 and ZnO NCs (Sarasqueta, et al., *Organic and inorganic Blocking Layers for Solution-Processed Colloidal PbSe Nanocrystal Infrared Photodetectors*. Adv. Funct. Mater. 2011, 21, 167-171).

However, the temporal and spectral distribution of midgap states must be confirmed, such as using the methodology listed in Example 8. Further, the charge neutralization of bare QD film is vital to proper functioning. Annealing of the QD deposited substrate while being grounded removes excess charge of the QDs, and also improves nanomorphology of the QD layer. Alternatively, a low voltage alternating low current is applied to the substrate for a short time, pulling any excess charge, whether be p-type or n-type, from the device.

Example 12

It was shown that FRET is highly dependent on QD assembly geometry, and was only efficient in close-packed monomodal superlattice (Corricelli et. al., *Near Infrared Emission from Monomodal and Bimodal PbS Nanocrystal Superlattices*, J. Phys. Chem. C. 2012, 116, 6143-6152). This effect is studied in two types of QD superlattice, namely the mono-size QD assembly and multi-size QD assembly. The inter-dot distance is to be controlled via QD concentration, size, temperature, and electric field. Both steady state and time-resolved PL are to be measured, as explained in Example 8. EL spectrum are measured using the same set up, by coupling the emission from the transparent ITO side. Both PL and EL efficiency are measured using a customized Newport integrating sphere (modified model 70679NS).

Depending on the size of QD and crystal structure of QD superlattice, the energy levels are different therefore the injection barriers at QD/contact interface is different. In addition, the work function of QD assembly is expected to be different than that of isolated QDs.

Unbalanced electron and hole mobility could cause non-uniform distribution of recombination which limits the LED device efficiency (Sun, et al., *Bright infrared quantum-dot light-emitting diodes through inter-dot spacing control*. Nat. Nanotechol. 2012, 7(6), 369-373). Tuning of carrier mobility can be done via QD superlattice symmetry, size and thickness, as well as thermal annealing conditions. Charging of QDs was shown to be detrimental to the device efficiency by increased Auger recombination. This is interesting since our QDs are originally doped (either p-type or n-type), by varying the amount of doping (can be measured by capacitance-voltage spectrum), we will investigate the change of PL and EL, as well as the radiative lifetime.

In the preceding specification, all documents, acts, or information disclosed does not constitute an admission that the document, act, or information of any combination thereof was publicly available, known to the public, part of the general knowledge in the art, or was known to be relevant to solve any problem at the time of priority.

The disclosure of all publications cited above are expressly incorporated herein by reference, each in its entirety, to the same extent as if each were incorporated by reference individually.

While there has been described and illustrated specific embodiments from the foregoing description, it will be apparent to those skilled in the art that variations and modifications are possible without deviating from the broad spirit and principle of the present invention. It is also to be understood that the following claims are intended to cover all of the generic and specific features of the invention herein described, and all statements of the scope of the invention which, as a matter of language, might be said to fall therebetween.

What is claimed is:

1. A thin film device, comprising:
   a substrate, having an upper face and a lower face;
   a first electrode disposed on the upper face of the substrate;
   at least one layer of bare quantum dots comprising group IV-VI elements disposed on the electrode, wherein the bare quantum dots have been stripped of all outer-layer ligands prior to deposition;
      wherein the at least one layer of bare quantum dots further comprises at least one alternating layer of n-type bare quantum dots and p-type bare quantum dots; and
   a second electrode disposed on the upper face of the at least one layer of bare quantum dots, wherein the first electrode and second electrode have different polarities.

2. The device of claim 1, wherein the group IV-VI elements are PbTe, PbSe, PbSe—PbTe, SbTe$_2$—PbTe, AgSbTe$_2$—PbSe, alloys of PbTe and PbSe, PbSn$_x$Se$_{1-x}$, or combinations thereof.

3. The device of claim 1, wherein the substrate is glass, quartz, plastic, polyethylene terephthalate, high density polyethylene, polyvinyl chloride, polypropylene, polystyrene, polyethylene, high impact polystyrene, low density polyethylene, polycarbonate, polyamide, or polyurethane.

4. The device of claim 1, wherein the at least one layer of bare quantum dots comprises a single-size multi-layer A$_n$, or an alternating multi-layer in the combination of A$_n$B$_m$, where A and B are different sized quantum dots, and n and m are indices for the repeating pattern of the quantum dots.

5. The device of claim 1, wherein the first electrode is indium tin oxide, zinc oxide, or a titanium oxide.

6. The device of claim 1, further comprising a PEDOT:PSS or ZnO/TiO$_2$ layer disposed on the first electrode.

7. The device of claim 1, wherein the second electrode disposed on the upper face of the at least one layer of bare quantum dots is aluminum, or gold.

8. The device of claim 1, further comprising a hole transport layer disposed on the at least one layer of bare quantum dots, wherein the hole transport layer is PEDOT:PSS, LiF, MoO$_3$, MoOx, or ZnSe/ZnTe.

9. The device of claim 8, wherein the hole transport layer is MoO$_3$ or PEDOT:PSS, and wherein
   the first electrode further comprises indium tin oxide;
   the second electrode further comprises gold or silver; and
   a ZnO/TiO$_2$ or ZnO layer disposed on the first electrode.

10. The device of claim 9, further comprising a ZnO layer disposed on the at least one layer of bare quantum dots.

* * * * *